United States Patent
Tsuchida

(10) Patent No.: US 11,756,846 B2
(45) Date of Patent: *Sep. 12, 2023

(54) GLASS CORE, MULTILAYER CIRCUIT BOARD, AND METHOD OF MANUFACTURING GLASS CORE

(71) Applicant: TOPPAN PRINTING CO., LTD., Tokyo (JP)

(72) Inventor: Tetsuyuki Tsuchida, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 457 days.

This patent is subject to a terminal disclaimer.

(21) Appl. No.: 15/930,696

(22) Filed: May 13, 2020

(65) Prior Publication Data
US 2020/0273763 A1    Aug. 27, 2020

Related U.S. Application Data

(63) Continuation of application No. PCT/JP2018/043056, filed on Nov. 21, 2018.

(30) Foreign Application Priority Data

Nov. 30, 2017    (JP) ................. 2017-229922

(51) Int. Cl.
*H05K 1/03*    (2006.01)
*H05K 1/11*    (2006.01)
(Continued)

(52) U.S. Cl.
CPC .......... *H01L 23/15* (2013.01); *H05K 1/0306* (2013.01); *H05K 1/11* (2013.01); *H05K 3/46* (2013.01); *H05K 1/116* (2013.01); *H05K 1/18* (2013.01)

(58) Field of Classification Search
CPC .............. H01L 23/15; H01L 23/49822; H01L 23/49827; H01L 23/49894; H01L 2224/13;
(Continued)

(56) References Cited

U.S. PATENT DOCUMENTS 6,339,197 B1 *    1/2002  Fushie ................... H05K 3/426
                                                     174/262
10,923,439 B2 *   2/2021  Tsuchida ........... H01L 23/49866
(Continued)

FOREIGN PATENT DOCUMENTS

JP    H10-56247 A    2/1998
JP    H10-154878 A   6/1998
(Continued)

OTHER PUBLICATIONS

Japanese Office Action issued in corresponding Japanese Application No. JP201722922 dated Mar. 22, 2022.
(Continued)

*Primary Examiner* — Ishwarbhai B Patel
(74) *Attorney, Agent, or Firm* — Foley & Lardner LLP

(57) ABSTRACT

A glass core, a multilayer circuit board, and a method of manufacturing a glass core that appropriately form copper wiring, and suppresses crack and the like, a glass core includes: a glass plate; a first metal layer provided on the glass plate; a first electrolytic copper plating layer provided on the first metal layer; a dielectric layer provided above the first electrolytic copper plating layer; a second metal layer provided on the dielectric layer; an electroless nickel plating layer provided on the second metal layer and having a phosphorus content of less than 5 mass %; and a second electrolytic copper plating layer provided on the electroless nickel plating layer.

10 Claims, 15 Drawing Sheets

(51) Int. Cl.
*H01L 23/15* (2006.01)
*H05K 3/46* (2006.01)
*H05K 1/18* (2006.01)

(58) Field of Classification Search
CPC ........ H05K 1/0306; H05K 3/46; H05K 1/162;
H05K 3/4605; H05K 3/108; H05K 3/388;
H05K 3/422; H05K 3/4644
See application file for complete search history.

(56) References Cited

U.S. PATENT DOCUMENTS

| | | |
|---|---|---|
| 2002/0100608 A1 | 8/2002 | Fushie et al. |
| 2003/0086248 A1* | 5/2003 | Mashino ................ H05K 1/162 |
| | | 361/767 |
| 2006/0000640 A1 | 1/2006 | Fushie et al. |
| 2006/0191710 A1 | 8/2006 | Fushie et al. |
| 2006/0201818 A1* | 9/2006 | Fushie ................ H05K 3/0023 |
| | | 205/183 |
| 2007/0062729 A1* | 3/2007 | Asai ..................... H05K 1/0269 |
| | | 174/262 |
| 2017/0250141 A1 | 8/2017 | Imayoshi |
| 2018/0166354 A1 | 6/2018 | Imayoshi |

FOREIGN PATENT DOCUMENTS

| | | |
|---|---|---|
| JP | 2001-044639 A | 2/2001 |
| JP | 2008-227177 A | 9/2008 |
| JP | 2011-155043 A | 8/2011 |
| JP | 2016-096262 A | 5/2016 |
| JP | 2017-005174 A | 1/2017 |

OTHER PUBLICATIONS

International Searching Authority, "Written Opinion," issued in connection with International Patent Application No. PCT/JP2018/043056, dated Feb. 5, 2019.

International Searching Authority, "International Search Report," issued in connection with International Patent Application No. PCT/JP2018/043056, dated Feb. 5, 2019.

\* cited by examiner

GLASS CORE, MULTILAYER CIRCUIT BOARD, AND METHOD OF MANUFACTURING GLASS CORE

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2018/043056, filed on Nov. 21, 2018, which is based upon and claims the benefit of priority to Japanese Patent Application No. 2017-229922, filed on Nov. 30, 2017, the disclosures of which are all incorporated herein by reference in their entireties.

TECHNICAL FIELD

The present invention relates to a glass core, a multilayer circuit board, and a method of manufacturing a glass core.

BACKGROUND ART

In recent years, electronic devices have become more sophisticated and compact. Accordingly, there has been a demand for increasing the density of semiconductor modules mounted on the electronic devices. To respond to such a demand, increasing the wiring density of a circuit board on which a semiconductor chip is mounted has been studied.

Typically, a glass epoxy resin is used as a core material included in the circuit board. In recent years, a circuit board including a glass plate as a core material has attracted attention. A glass plate can achieve a higher degree of smoothness than a core material made of a glass epoxy resin. For this reason, ultrafine wires can be formed on a circuit board including a glass plate, and, thus, high-density implementation is possible by using a circuit board including a glass plate. The coefficient of linear thermal expansion (CTE) of a glass plate, within the temperature range of 20° C. or more and 260° C. or less, almost coincides with the coefficient of linear thermal expansion of a semiconductor chip made of a silicon substrate within the temperature range of 20° C. or more and 260° C. or less. Therefore, the use of a circuit board including a glass plate allows implementation with reduced residual stress. Furthermore, a circuit board including a glass plate is advantageous in that it is excellent for high-speed communication. From the foregoing points, a circuit board including a glass plate has been attracting attention as a wiring substrate of semiconductor modules to be mounted in high-performance electronic devices.

[Citation List] [Non-Patent Literature] NPL 1: Takagi, Kiyoshi, Yokuwakaru purinto haisenban no dekirumade (Easy to Understand Manufacturing Processes for Printed Circuit Boards), 2$^{nd}$ Edition, April 2008, pp. 201-202, Nikkan Kogyo Shimbun, Ltd.

SUMMARY OF THE INVENTION

Technical Problem

A circuit board or a portion of a circuit board is formed by forming wires on a glass plate. This is referred to as a glass core. When wires are formed on a glass plate, typically, a semi-additive process is applied (NPL 1). Such a process can be applied to provide an insulating resin layer after a conduction layer has been formed on a glass plate, and stack a conductor on the insulating resin layer, to form multiple layers of wires. However, when a dielectric layer is provided on a glass plate, it is difficult to apply a conventional semi-additive process. The reason for this will be described.

There is a process of providing a seed layer on a glass plate, providing an electrolytic copper plating layer on the seed layer, etching unnecessary parts of the seed layer, providing a dielectric layer on the electrolytic copper plating layer, and further providing another electrolytic copper plating layer on the dielectric layer. According to the process, a dielectric layer can be provided without an insulating resin layer. However, an undercut in the electrolytic copper plating layer formed on the glass plate via the seed layer formed when unnecessary parts of the seed layer is etched causes a new issue in that the electrolytic copper plating layer cannot be formed on the dielectric layer.

As a countermeasure, another process may be considered in which a metal layer formed by sputtering and a seed layer including an electroless nickel plating layer are formed on a glass plate, an electrolytic copper plating layer is formed on the electroless nickel plating layer, a dielectric layer is formed on the electrolytic copper plating layer on the glass plate, and another electrolytic copper plating layer is formed on the dielectric layer. Such a process can suppress the formation of an undercut in the electrolytic copper plating layer.

However, when the phosphorus content in the electroless nickel plating layer is high, an alkaline etching agent should be used for etching of unnecessary parts of the electroless nickel plating layer. In such a case, there is problem in that the damage to the glass plate caused by the alkaline etching agent may cause the glass plate to break during the manufacturing process. Also, when an alkaline etching agent is used, there are cases in which a defect in the formation of the electrolytic copper plating layer on the dielectric layer occurs due to an undercut in the electrolytic copper plating layer formed on the glass plate via the glass plate.

Furthermore, when a through-hole is formed in the glass plate for multilayer wiring and a seed layer including an electroless nickel plating layer is formed in the through-hole, there is a problem in that stress of the copper accumulates in the through-hole during etching of unnecessary parts of the seed layer if the thickness of the glass is small, and thereby glass cracking occur. To avoid such a problem, cracking need to be prevented by easing the stress of the copper applied to the glass plate by immediately forming an insulating resin layer after the electrolytic copper plating layer has been formed in the through-hole. Therefore, it is necessary to provide a step of providing an insulating resin layer immediately after the electrolytic copper plating layer has been formed in the through-hole, and this leads to a complicated manufacturing process.

The present invention, which has been conceived in view of the above-described issue, provides a glass core, a multilayer circuit board, and a method of manufacturing a glass core that enables appropriate formation of copper wiring and suppresses cracking and the like.

Solution to Problem

According to an aspect of the present invention, a glass core includes a glass plate; a first metal layer disposed on the glass plate; a first electrolytic copper plating layer disposed on the first metal layer; a dielectric layer disposed above the first electrolytic copper plating layer; a second metal layer disposed on the dielectric layer; an electroless nickel plating layer disposed on the second metal layer and having a phosphorus content of less than 5 mass %; and a second electrolytic copper plating layer disposed on the electroless nickel plating layer.

According to an aspect of the present invention, a method of manufacturing a glass core, includes forming a first metal layer on a glass plate; forming a first electrolytic copper plating layer above the first metal layer; forming a dielectric layer on the first electrolytic copper plating layer; forming a second metal layer on the dielectric layer; forming an electroless nickel plating layer disposed on the second metal layer and having a phosphorus content of less than 5 mass %; forming a second electrolytic copper plating layer disposed on the electroless nickel plating layer; and removing unnecessary parts of the electroless nickel plating layer using an acidic etching agent.

Advantageous Effects of Invention

The embodiments of the present invention provide a glass core, a multilayer circuit board, and a method of manufacturing a glass core that enables appropriate formation of copper wiring and suppresses cracking and the like.

DETAILED DESCRIPTION

Figure 1:
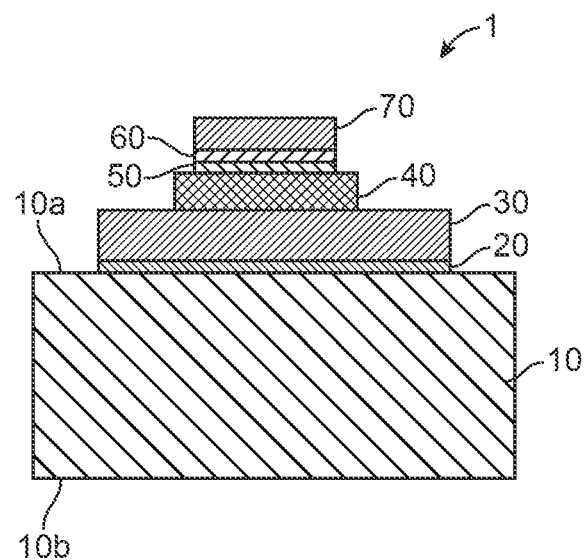
FIG. 1 is a schematic cross-sectional view of a glass core 1 according to an aspect of the present invention.

With reference to the accompanying Figures, a description will now be given of representative embodiments according to the present invention. The present invention is not limited to the following representative embodiments, and appropriate modifications can be made without departing from the spirit of the present invention. The representative embodiments described below are merely examples of the present invention, and the design thereof could be appropriately changed by one skilled in the art. Here, the drawings are schematic, and the relationship between thickness and plane size, the ratio of the thickness of each layer, etc., may be different from actual ones. The embodiments described below are merely examples of the configurations for embodying the technical idea of the present invention, and the technical idea of the present invention should not limit the materials, shapes, structures, and the like of the components to those described below. The technical idea of the present invention can be modified in various ways within the technical scope specified by the claims.

The same constituent elements are denoted by the same reference numerals unless there is a reason for the sake of convenience, and redundant description is omitted. In the drawings referred to in the following description, for clarity, characteristic parts are enlarged, and thus the components are not shown to scale. It is, however, clear that one or more embodiments can be implemented without such details. In addition, known structures and devices may be schematically represented for simplicity.

Hereinafter, aspects of the present invention will be described with reference to the drawings. In the following description, components with identical elements or identical functions will be given identical reference signs, and redundant description thereof will be omitted.

Note that, in the specification, the term "above (upper)" refers to being farther from the glass plate, and the term "below (under)" refers to being closer to the glass plate.

FIG. 1 is a schematic cross-sectional view of a glass core 1 according to an aspect of the present invention.

The glass core 1 illustrated in FIG. 1 includes a glass plate 10, a first metal layer 20, a first electrolytic copper plating layer 30, a dielectric layer 40, a second metal layer 50, an electroless nickel plating layer 60, and a second electrolytic copper plating layer 70.

The glass plate 10 typically has light permeability. There are no particular limitations on the components and their ratios of a glass material for the glass plate 10. The glass plate 10 can be made from glass having silicate as the main component, such as alkali-free glass, alkali glass, borosilicate glass, quartz glass, sapphire glass, or light-sensitive glass, for example. From the viewpoint of being used for a semiconductor package and a semiconductor module, the glass plate 10 is desirably made from alkali-free glass. The alkali component content of the alkali-free glass is preferably 0.1 mass % or less.

The thickness of the glass plate 10 is preferably 1 mm or less. The thickness of the glass plate 10 is more preferably within the range of 0.1 or more and 0.8 mm or less, in consideration of ease of handling during manufacture.

Examples of a method for manufacturing the glass plate 10 include a float method, a down-draw method, a fusion method, an up-draw method, and a roll-out method. The glass plate 10 may be produced by any of the foregoing methods.

The coefficient of linear thermal expansion (CTE) of the glass plate 10 is preferably within the range of $0.5 \times 10^{-6}$/K or more and $15.0 \times 10^{-6}$/K or less in the temperature range of 20° C. or more and 260° C. or less, preferably within the range of $1.0 \times 10^{-6}$/K or more and $8.0 \times 10^{-6}$/K or less, and further preferably within the range of $1.0 \times 10^{-6}$/K or more and $4.0 \times 10^{-6}$/K or less. When the coefficient of linear thermal expansion of the glass plate 10 is in this range, the difference from the coefficient of linear thermal expansion of a semiconductor chip including a silicon substrate to be mounted on the surface of the core substrate 1 tends to be small. The coefficient of linear thermal expansion refers to the ratio of change in length corresponding to temperature rise.

At least the first main surface of the glass plate 10 may include a functional layer. Examples of the functional layer include an antireflection layer containing fine particles, an infrared shielding layer containing an infrared absorbing agent, a strength imparting layer containing a hard coat material, an antistatic layer containing an antistatic agent, a color layer containing a coloring agent, an optical filter layer containing an optical thin film, a texture control layer and an antiglare layer containing a light scattering film. These functional layers can be formed by surface treatment techniques such as evaporation, sputtering, or wet-spraying, for example.

The first metal layer 20 and the second metal layer 50 are typically formed by sputtering or chemical vapor deposition (CVD).

The first metal layers 20 and the second metal layer 50 may be formed from, for example, copper (Cu), aluminum (Al), titanium (Ti), chromium (Cr), molybdenum (Mo), tungsten (W), tantalum (Ta), gold (Au), iridium (Ir), ruthenium (Ru), palladium (Pd), platinum (Pt), Al—Si alloy, Al—Si—Cu alloy, Al—Cu alloy, Ni—Fe alloy, indium tin oxide (ITO), indium zinc oxide (IZO), active zinc oxide (AZO), zinc oxide (ZnO), lead zirconate titanate (PZT), titanium nitride (TiN), $Cu_3N_4$, Cu alloy, a mixture of these, a monolayer film, or a laminated film.

The first metal layer 20 is preferably a sputtered laminated film of titanium and copper, i.e., a laminate of a titanium layer and a copper layer formed separately by sputtering. The titanium layer can enhance the adhesion with the glass plate 10. The copper layer can enhance the adhesion of the titanium layer and the electrolytic copper plating layer 30. That is, by forming the metal layer 20 as a sputtered laminated film of titanium and copper, the first electrolytic copper plating layer 30 having satisfactory adhesiveness can be formed on the glass plate 10.

The second metal layer 50 is also preferably a sputtered laminated film of titanium and copper, like the first metal layer 20. The titanium layer can enhance the adhesion with the dielectric layer 40. By providing a copper layer having satisfactory adhesion with the titanium layer on the titanium layer, an electroless nickel plating layer 60 can be provided on the copper layer.

When the first metal layer 20 and the second metal layer 50 are sputtered laminated films of titanium and copper, the thickness of the titanium layer is preferably within the range of 0.01 or more and 0.1 μm or less. The thickness of the copper layer is preferably within the range of 0.09 or more and 0.5 μm of less. If any of these values is lower than a lower limit value, the throwing power relative to the base material is lowered and the film is undesirably accompanied by pinholes. If the values exceed an upper limit value, no enhancement of performance is observed, and this is not preferable in terms of cost.

A sputtered layer, such as titanium, for example, may be provided as an adhesive layer between the first electrolytic copper plating layer 30 and the dielectric layer 40.

The film of the electroless nickel plating layer 60 contains phosphorus (P). The phosphorus content in the plating film is preferably within the range of 0.1 mass % or more and less than 5 mass %, more preferably within the range of 0.5 mass % or more and less than 5 mass %, but 0 mass % or more can be sufficient.

When the phosphorus content in the film of the electroless nickel plating layer 60 is within the range of 0.1 mass % or more and less than 5 mass %, an acid etching agent can be used to etch the electroless nickel plating layer that is not needed in the manufacturing process. In this way, glass corrosion and damage to the dielectric layer during etching can be prevented. In contrast, when the phosphorus content is 5 mass % or more, an alkaline etching agent must be used under a high temperature condition to etch the electroless nickel plating layer that is not needed in the manufacturing process. Therefore, glass corrosion or damage to the dielectric layer may occur during etching. Therefore, to prevent glass from cracking and to obtain capacitor characteristics, the phosphorus content of the film of the electroless nickel plating layer 60 is preferably within the range of 0.1 (preferably 0.5) mass % or less than 5 mass %.

The phosphorus content of the film of the electroless nickel plating layer 60 can be obtained by X-ray fluorescence elemental analysis (XRF), such as energy-dispersive X-ray analysis (EDX), for example.

The film of the electroless nickel plating layer 60 may contain other components such as sulfur (S), lead (Pb), and bismuth (Bi) in addition to nickel and phosphorus.

The thickness of the electroless nickel plating layer 60 is typically 1 μm or less, desirably 0.4 μm or less, more desirably 0.3 μm or less, further desirably 0.1 μm or less. If the thickness of the electrolytic nickel plating layer 30 is small, the time required for the formation and etching of the electroless nickel plating layer 60 is reduced, thereby facilitating the manufacturing.

The thickness of the electroless nickel plating layer 60 can be obtained by X-ray fluorescence elemental analysis, for example.

The interface of the second metal layer 50 and the electroless nickel plating layer 60 includes palladium, or palladium and tin. The palladium and tin act as a catalyst during formation of an electroless nickel plating film. Furthermore, the second metal layer 50 and the interface including palladium may further include an adhesive layer for enhancing the adhesion between the electroless nickel plating layer 60 and the second metal layer 50.

An electroless copper plating layer cannot replace the electroless nickel plating layer 60. This is because an electroless copper plating bath has a high pH of approximately 12. Thus, an electroless copper plating layer provided on a dielectric layer damages the dielectric layer. Furthermore, the electroless copper plating layer has poor adhesion to the glass, and the electroless copper plating film deposited at the end of the glass is stripped away in the electroless copper plating bath thereby undesirably promoting decomposition of the electroless copper plating bath.

The thicknesses of the first electrolytic copper plating layer 30 and the second electrolytic copper plating layer 70 desirably are within the range of 1 or more and 20 μm or less, and more preferably within the range of 3 or more and 18 μm or less.

The dielectric layer 40 may contain an inorganic compound, for example. Examples of the inorganic compound include oxides, carbides, nitrides, and borides containing at least one kind of element selected from the group consisting of aluminum, titanium, tantalum, chromium, lanthanum, samarium, ytterbium, yttrium, gadolinium, zirconium, niobium, hafnium, gallium, cerium, and silicon.

The dielectric layer 40 desirably contains at least one of silicon nitride, tantalum oxide, and aluminum oxide. Silicon nitride, tantalum oxide, and aluminum oxide are low in dielectric constant and are excellent in insulation properties.

The dielectric layer 40 is typically formed by sputtering or chemical vapor deposition (CVD).

The first metal layer 20, the first electrolytic copper plating layer 30, the dielectric layer 40, the second metal layer 50, the electroless nickel plating layer 60, and the second electrolytic copper plating layer 70, as illustrated in FIG. 1, are provided on a glass main surface 10a. However, these may be provided on a glass main surface 10b opposing the glass main surface 10a, or on both the glass main surfaces 10a and 10b.

A conduction layer below the dielectric layer 40 including the first metal layer 20 and the first electrolytic copper plating layer 30, the dielectric layer 40, and a conduction layer above the dielectric layer 40 including the second metal layer 50, the electroless nickel plating layer 60, and the second electrolytic copper plating layer form a capacitor.

Figure 2:
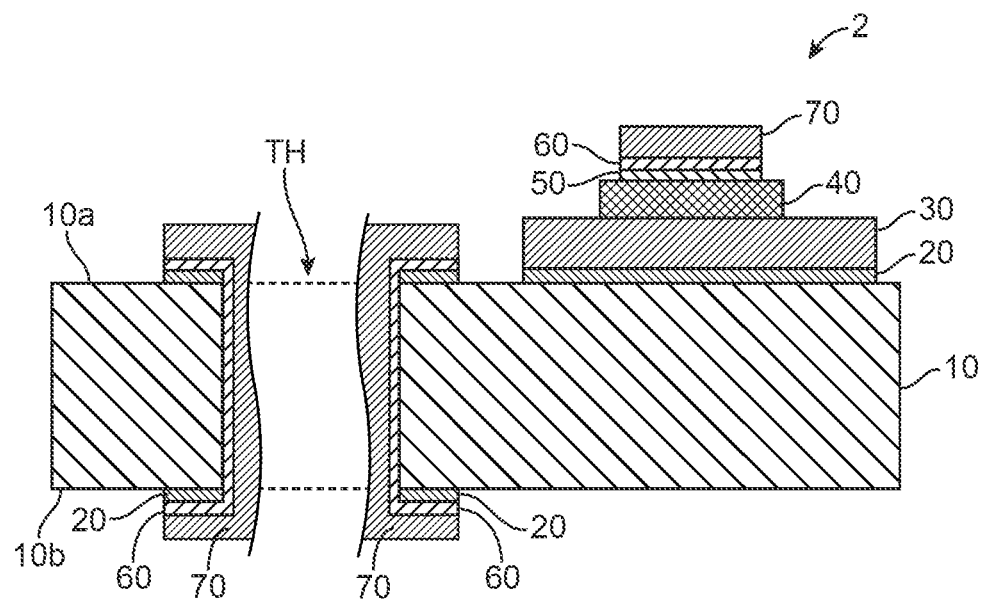
FIG. 2 is a schematic cross-sectional view of a glass core 2 having a through-hole according to an aspect of the present invention.

FIG. 2 is a schematic cross-sectional view of a glass core 2 having a through-hole according to an aspect of the present invention.

The glass core 1 illustrated in FIG. 2 includes a glass plate 10, a through-hole TH, a first metal layer 20, a first electrolytic copper plating layer 30, a dielectric layer 40, a second metal layer 50, an electroless nickel plating layer 60, and a second electrolytic copper plating layer 70.

The shape of a cross section of the through hole TH in the axial direction may be a rectangle, an X shape in which the diameter of the center part of the through hole TH is smaller than that at a first end and a second end, a tapered shape in which the bottom diameter of the through hole TH is smaller than the diameter at the first end, an O shape in which the diameter of the center part of the through hole TH is larger than the diameter at the first end and the diameter at the second, or any other shape. Moreover, the shape of a cross section of the through hole TH orthogonal to the axial direction may be a circle, an oval, or a polygon.

By providing a conduction layer including the electroless nickel plating layer 60 and the second electrolytic copper plating layer 70 in the through-hole TH, the glass main surface 10a and the glass main surface 10b can be made electrically conductive with each other. A portion of the through-hole TH may be covered with the first metal layer.

The portion between the inner wall of the through-hole TH and the electroless nickel plating layer 60 includes palladium, or palladium and tin. The palladium and tin act as a catalyst during electroless nickel plating. Furthermore, the inner wall of the through-hole TH and the interface including palladium may further include an adhesive layer for enhancing the adhesion between the electroless nickel plating layer 60 and the glass in the through-hole TH.

Figure 3:
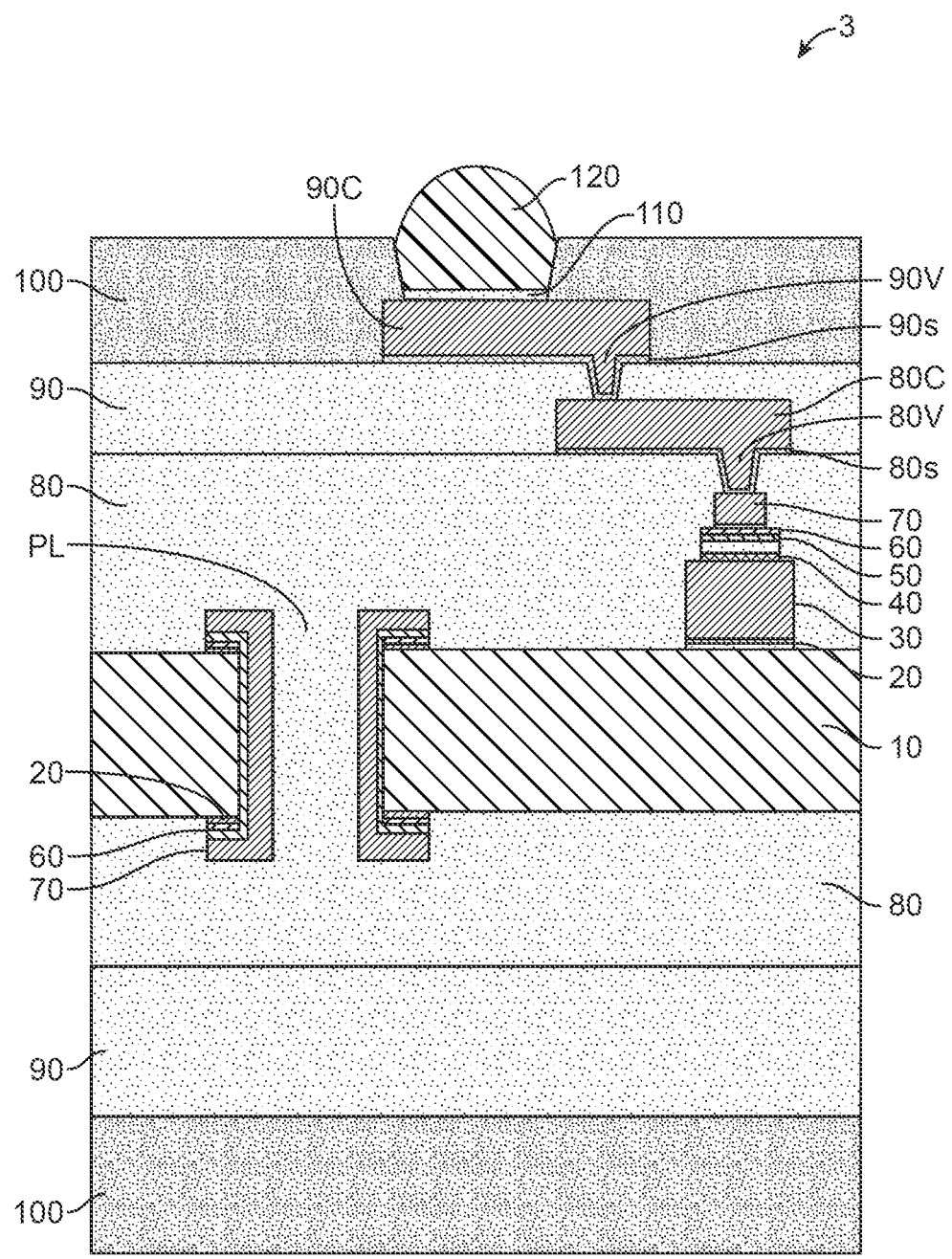
FIG. 3 is a schematic cross-sectional view of a multilayer circuit board 3 including a glass core 2 having a through-hole according to an aspect of the present invention.

FIG. 3 is a schematic cross-sectional view of a multilayer circuit board 3 including a glass core 2 having a through-hole according to an aspect of the present invention.

The multilayer circuit board illustrated in FIG. 3 includes the glass core 2 as a base, and further includes a glass plate 10, a first metal layer 20, a first electrolytic copper plating layer 30, a dielectric layer 40, a second metal layer 50, an electroless nickel plating layer 60, and a second electrolytic copper plating layer 70, a first resin layer 80, a second resin layer 90, a plug PL made of resin, a solder resist layer 100, a via 80V, a via 90V, a seed layer 80*s*, a seed layer 90*s*, an electrolytic copper plating layer 80C, an electrolytic copper plating layer 90C, a surface-treatment layer 110, and a solder layer 120.

The first resin layer 80 and the second resin layer 90 may be made of any of an epoxy resin, a polyimide resin, a maleimide resin, polyethylene terephthalate, polyphenylene oxide, liquid crystal polymer, or a composite material of them. The resin is desirably an epoxy resin containing a filler from the viewpoints of electrical characteristics and the ease of manufacture. The filler can be silica, barium sulfate, titanium oxide, or a mixture of them, for example. The resin may be a conductive paste or a conductive resin.

The plug PL is formed by filling, with resin, a hollow portion in the through-hole TH not filled with the electroless nickel plating layer 60 and the second electrolytic copper plating layer 70, and is integrated with the first resin layer 80.

The via 80V and the via 90V are formed by processing the first resin layer 80 and the second resin layer 90 with a laser or the like if the first resin layer 80 and the second resin layer 90 are made of a non-photosensitive material, and by photolithography in the case where they are made of a photosensitive material.

The seed layers 80*s* and 90*s* are preferably electrolytic nickel plating films or electroless copper plating films. Alternatively, nickel or copper may be deposited into a film by sputtering.

For the surface treatment layer 110, a plating film such as tin plating, tin alloy plating, electroless Ni—P/electroless Pd—P/Au plating, or electroless Ni—P/Au plating may be used. The surface treatment layer 110 may use organic films instead of plating films. The organic films may be pre-solder treatment films or pre-flux treatment films such as organic solderability preservative (OSP).

The solder layer 120 is provided on the surface treatment layer 110. The solder layer 120 contains tin, silver, copper, bismuth, lead, zinc, indium, antimony, or a mixture of them.

Figure 4A:
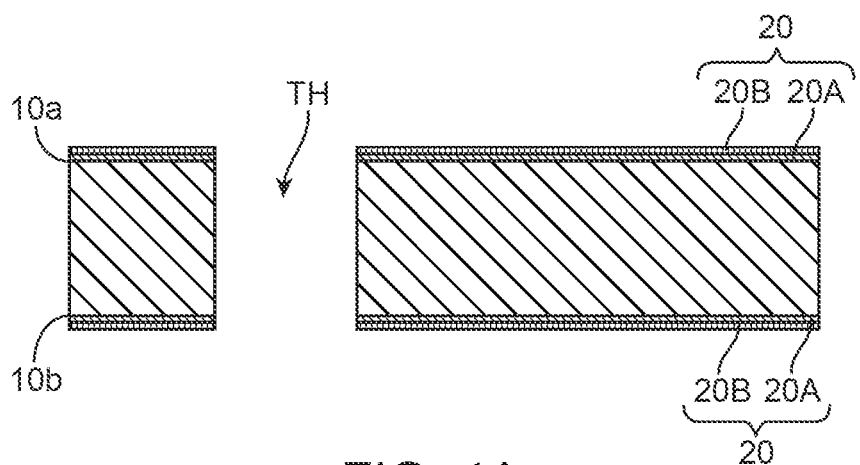
FIG. 4A is a schematic cross-sectional view of the manufacturing process of a multilayer circuit board 3 including a glass core 2 having a through-hole according to an aspect of the present invention.
Figure 4B:
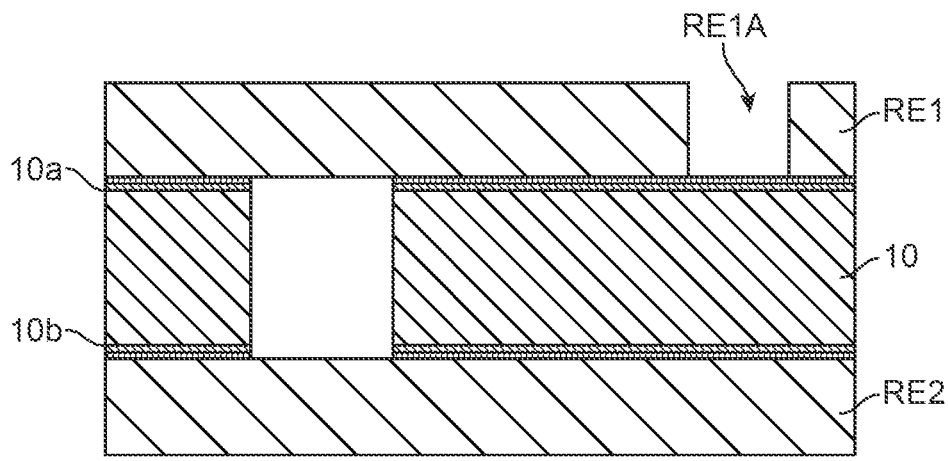
FIG. 4B is a schematic cross-sectional view of the manufacturing process of a multilayer circuit board 3 including a glass core 2 having a through-hole according to an aspect of the present invention.
Figure 4C:
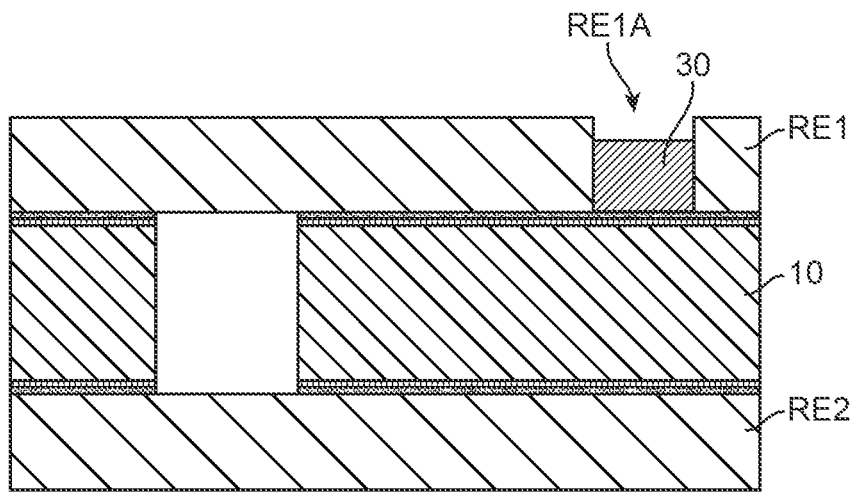
FIG. 4C is a schematic cross-sectional view of the manufacturing process of a multilayer circuit board 3 including a glass core 2 having a through-hole according to an aspect of the present invention.
Figure 4D:
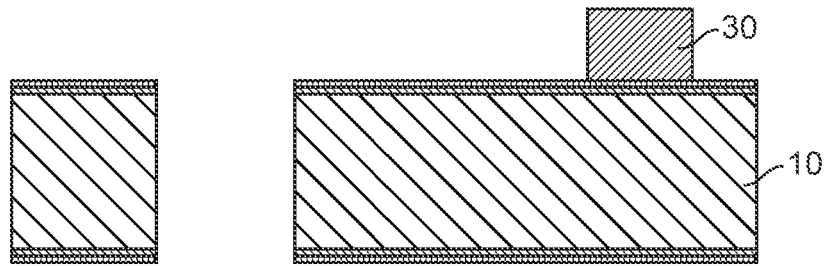
FIG. 4D is a schematic cross-sectional view of the manufacturing process of a multilayer circuit board 3 including a glass core 2 having a through-hole according to an aspect of the present invention.
Figure 4E:
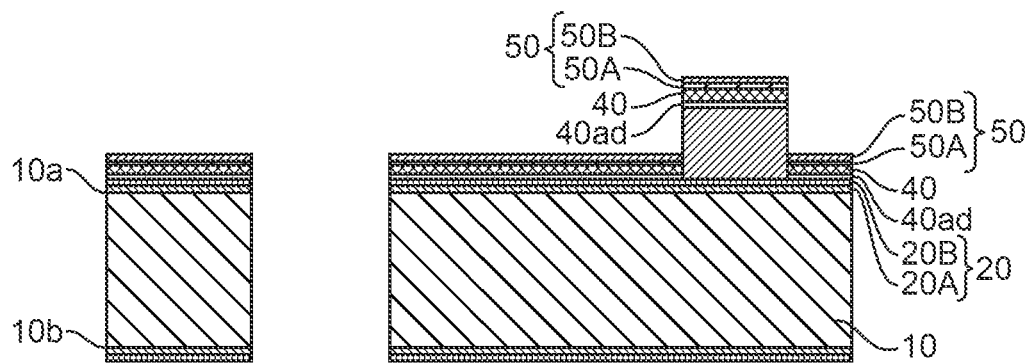
FIG. 4E is a schematic cross-sectional view of the manufacturing process of a multilayer circuit board 3 including a glass core 2 having a through-hole according to an aspect of the present invention.
Figure 4F:
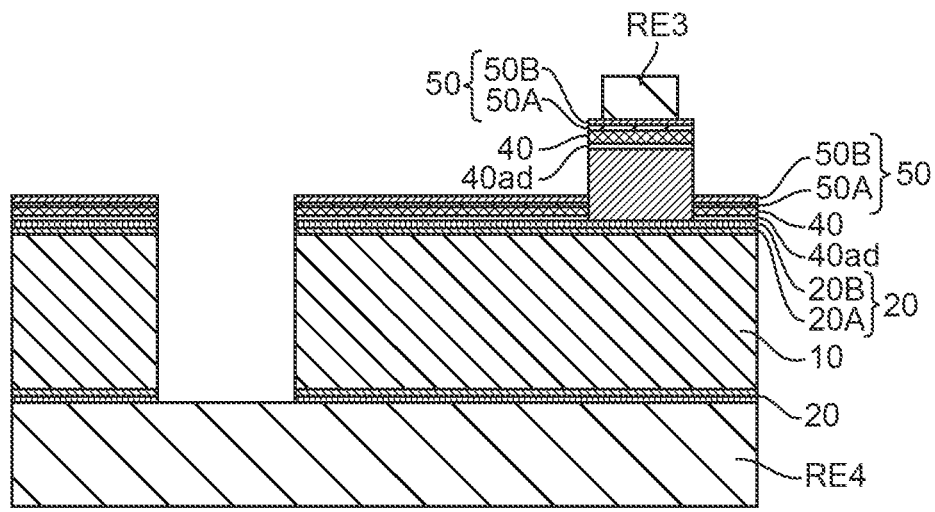
FIG. 4F is a schematic cross-sectional view of the manufacturing process of a multilayer circuit board 3 including a glass core 2 having a through-hole according to an aspect of the present invention.
Figure 4G:
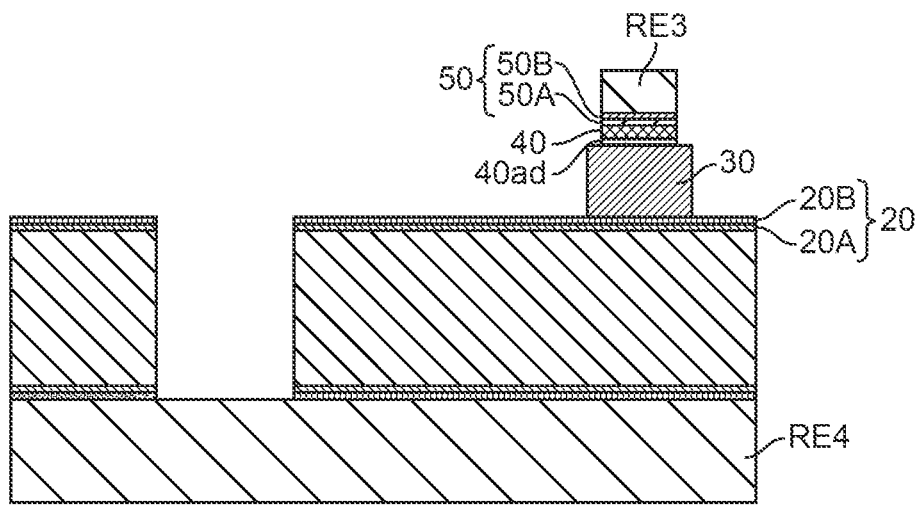
FIG. 4G is a schematic cross-sectional view of the manufacturing process of a multilayer circuit board 3 including a glass core 2 having a through-hole according to an aspect of the present invention.
Figure 4H:
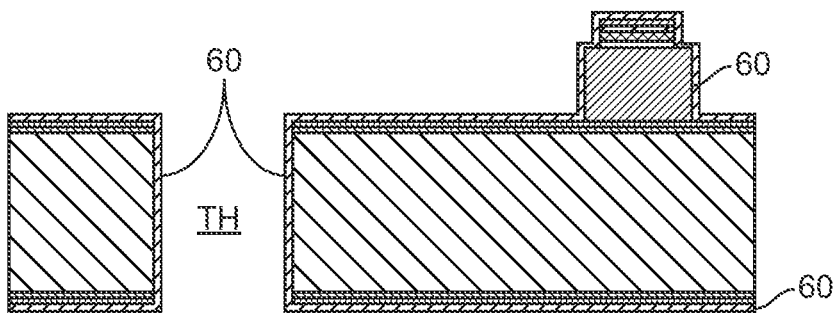
FIG. 4H is a schematic cross-sectional view of the manufacturing process of a multilayer circuit board 3 including a glass core 2 having a through-hole according to an aspect of the present invention.
Figure 4I:
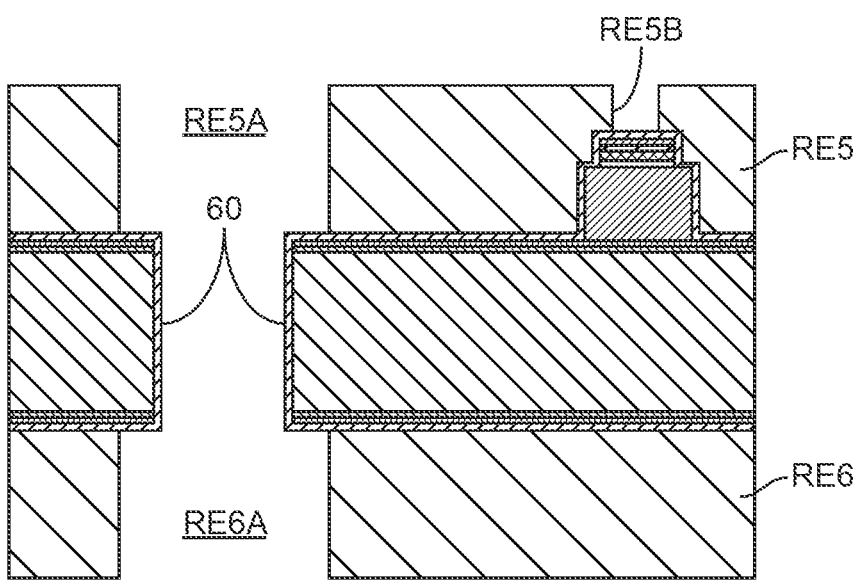
FIG. 4I is a schematic cross-sectional view of the manufacturing process of a multilayer circuit board 3 including a glass core 2 having a through-hole according to an aspect of the present invention.
Figure 4J:
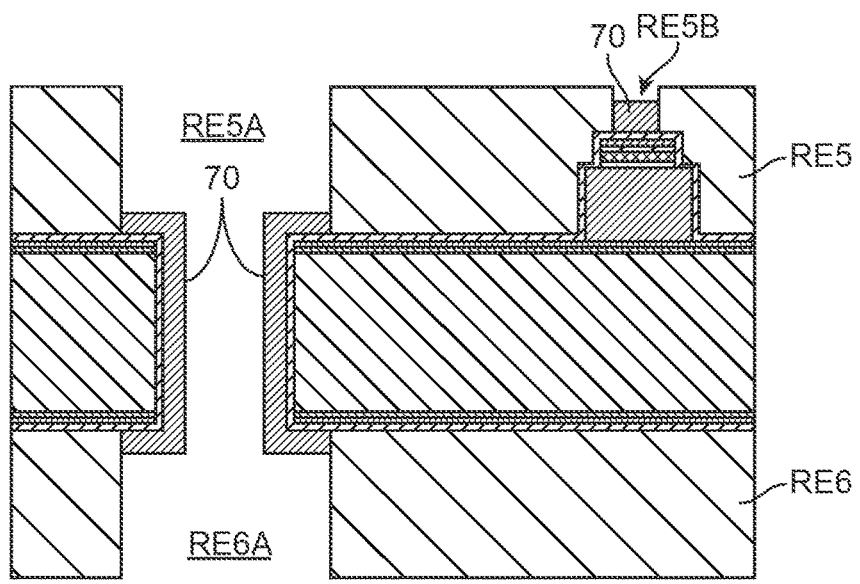
FIG. 4J is a schematic cross-sectional view of the manufacturing process of a multilayer circuit board 3 including a glass core 2 having a through-hole according to an aspect of the present invention.
Figure 4K:
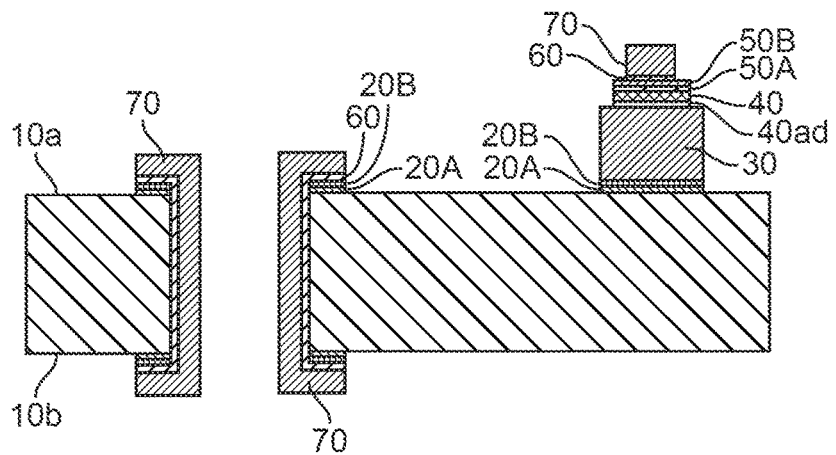
FIG. 4K is a schematic cross-sectional view of the manufacturing process of a multilayer circuit board 3 including a glass core 2 having a through-hole according to an aspect of the present invention.
Figure 4L:
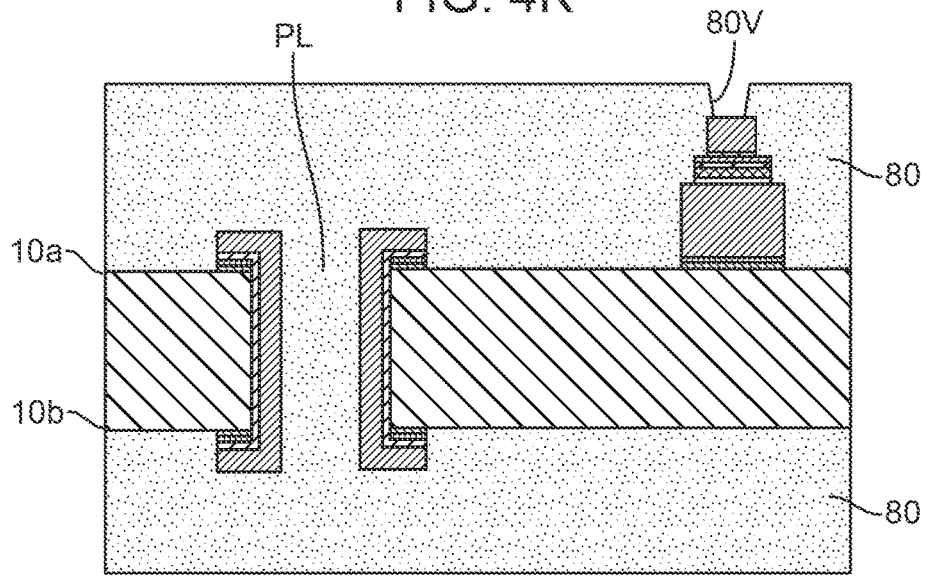
FIG. 4L is a schematic cross-sectional view of the manufacturing process of a multilayer circuit board 3 including a glass core 2 having a through-hole according to an aspect of the present invention.
Figure 4M:
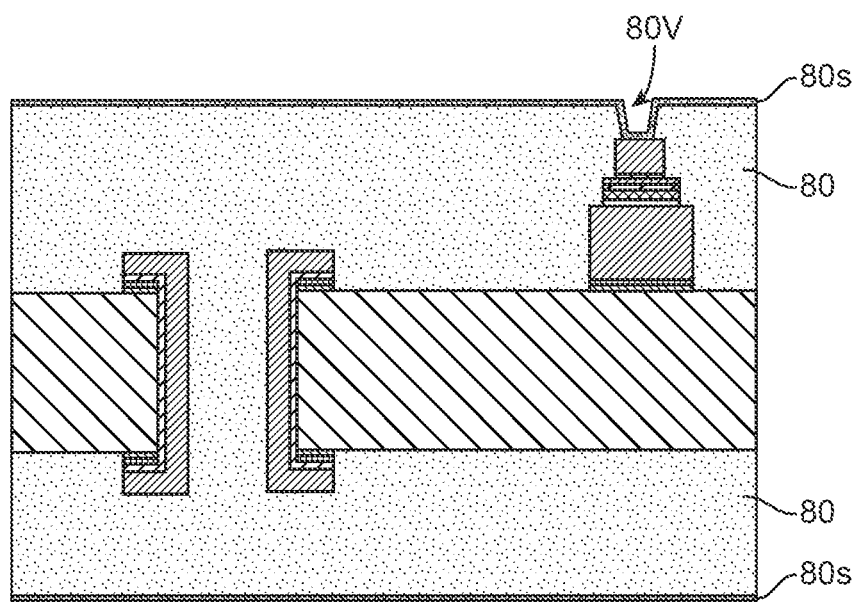
FIG. 4M is a schematic cross-sectional view of the manufacturing process of a multilayer circuit board 3 including a glass core 2 having a through-hole according to an aspect of the present invention.
Figure 4N:
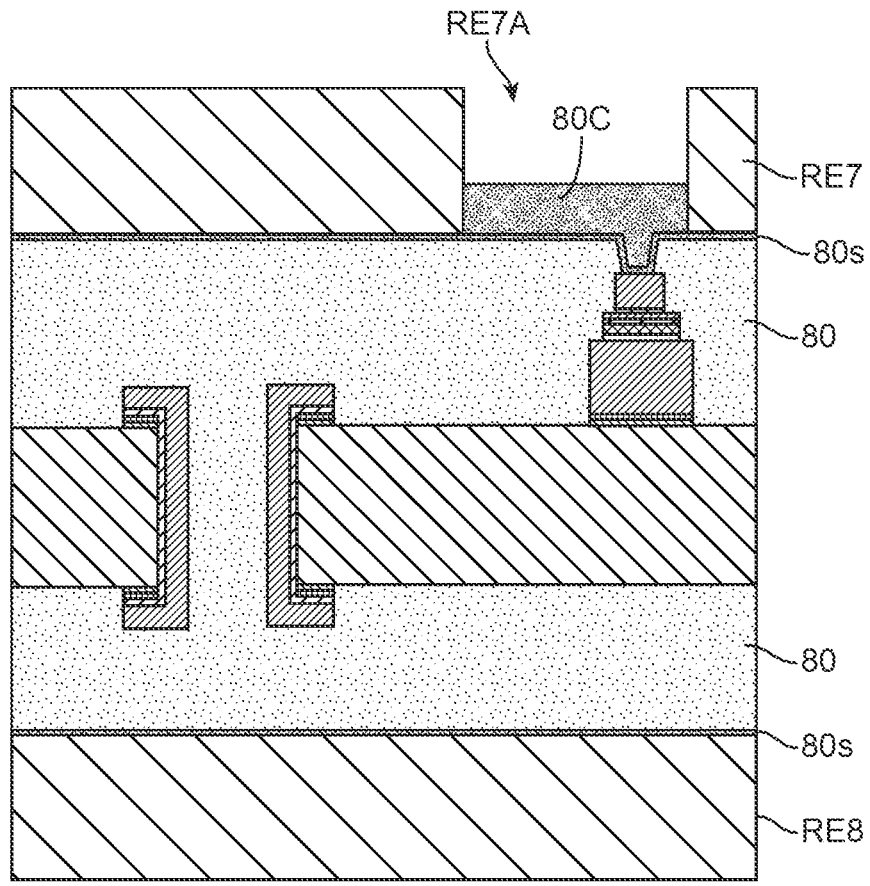
FIG. 4N is a schematic cross-sectional view of the manufacturing process of a multilayer circuit board 3 including a glass core 2 having a through-hole according to an aspect of the present invention.
Figure 4O:
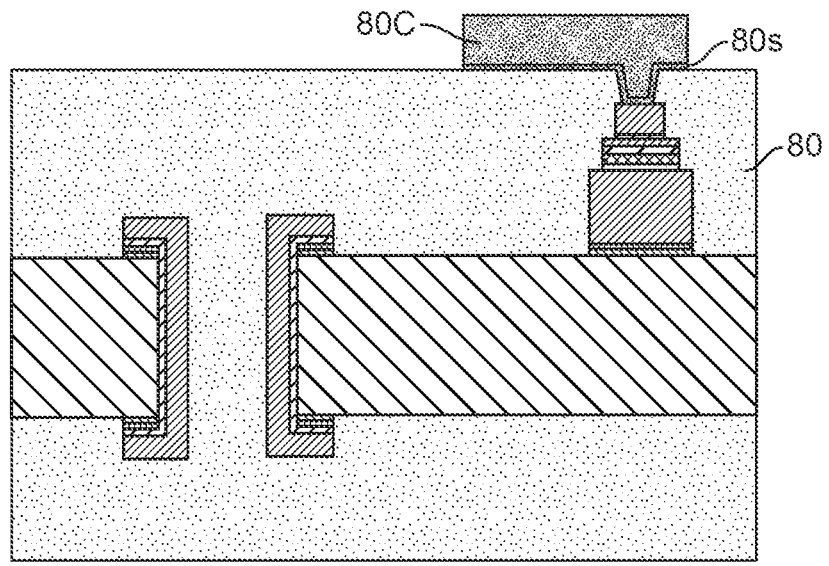
FIG. 4O is a schematic cross-sectional view of the manufacturing process of a multilayer circuit board 3 including a glass core 2 having a through-hole according to an aspect of the present invention.
Figure 4P:
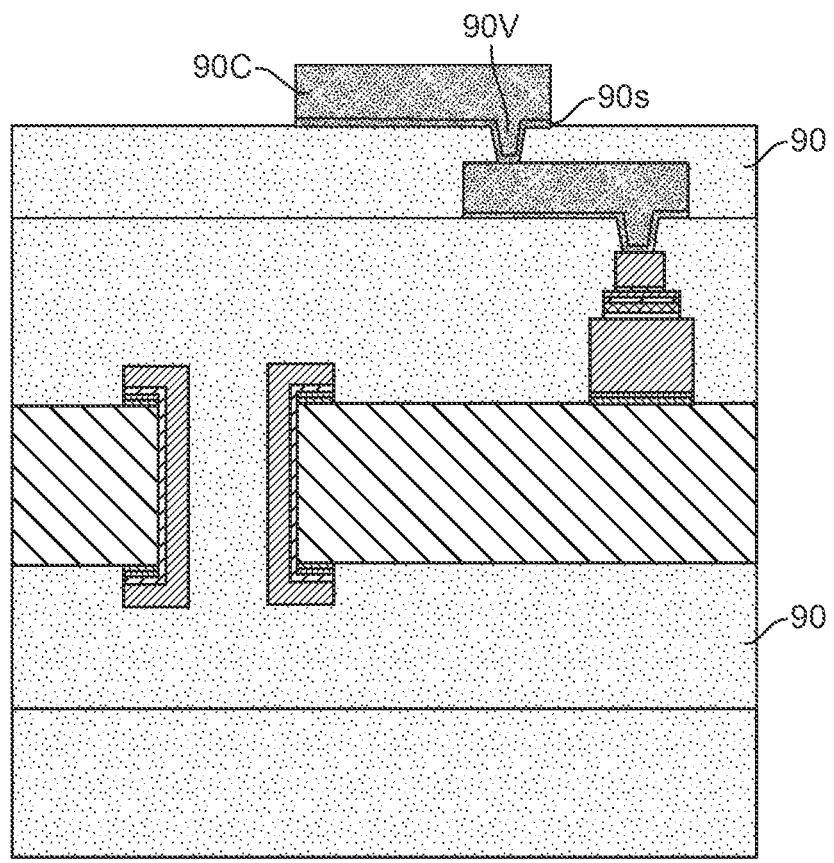
FIG. 4P is a schematic cross-sectional view of the manufacturing process of a multilayer circuit board 3 including a glass core 2 having a through-hole according to an aspect of the present invention.
Figure 4Q:
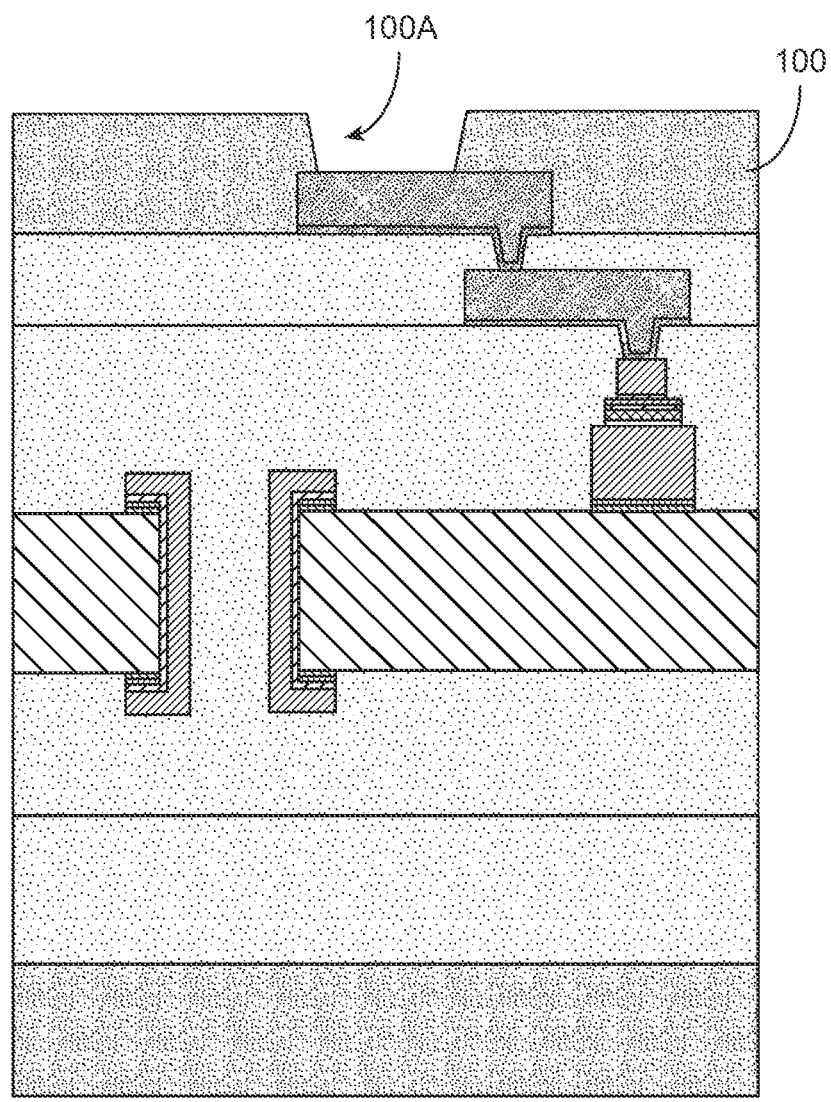
FIG. 4Q is a schematic cross-sectional view of the manufacturing process of a multilayer circuit board 3 including a glass core 2 having a through-hole according to an aspect of the present invention.
Figure 4R:
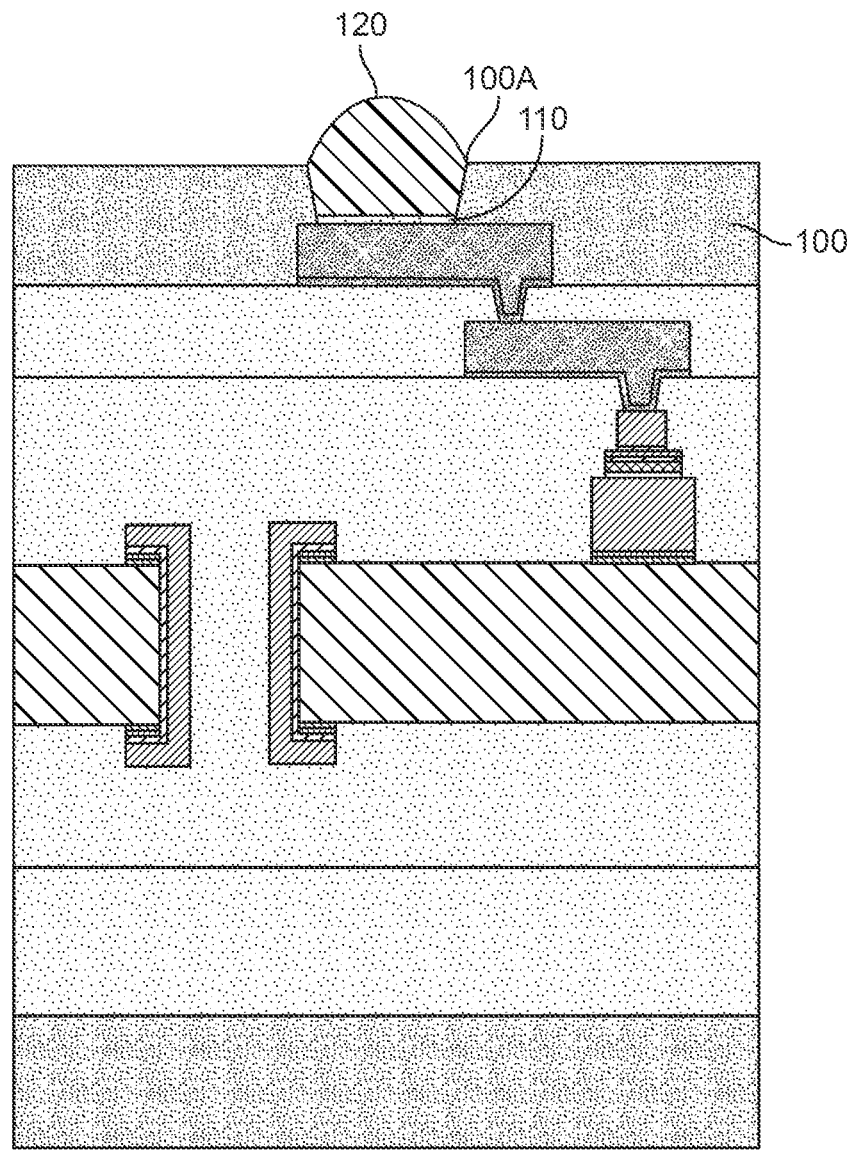
FIG. 4R is a schematic cross-sectional view of the manufacturing process of a multilayer circuit board 3 including a glass core 2 having a through-hole according to an aspect of the present invention.

FIGS. 4A to 4R schematic illustrate the manufacturing process of a multilayer circuit board 3 including a glass core 2 having a through-hole according to an aspect of the present invention.

First, on the glass main surface 10*a* and the main surface 10*b* opposing the glass main surface 10*a* of the glass plate 10 having a through-hole TH, as illustrated in FIG. 4A, a sputtered laminated film of a titanium layer 20A and a copper layer 20B are formed in order from the glass side as the first metal layers 20. The first metal layers 20 may cover part of the inside of the through-hole TH.

Next, as illustrated in FIG. 4B, a dry film resist is laminated on the copper layer 20B on the glass main surface 10*a* using a roll laminator or the like, and a first resist layer RE1 having an opening RE1A is formed by photolithography. Moreover, the same method is used to form a second resist layer RE2 on the glass main surface 10*b*.

Since the first resist layer RE1 or the second resist layer RE2 is stripped away in subsequent processing, the first resist layer RE1 or the second resist layer RE2 may fill the through-hole TH in this step.

Next, as illustrated in FIG. 4C, the electrolytic copper plating layer 30 is formed in the opening RE1A illustrated in FIG. 4B. Although it is preferable that electrolytic copper plating be performed in a copper sulfate plating bath, which is inexpensive and easy to control, the plating may also be performed in, for example, a copper pyrophosphate plating bath.

Next, as illustrated in FIG. 4D, the first resist layer RE1 and the second resist layer RE2 are stripped way a sodium hydroxide solution, a TMAH solution, or the like.

Next, as illustrated in FIG. 4E, an adhesive layer 40*ad*, the dielectric layer 40, and a titanium layer 50A and a copper layer 50B as the second metal layer 50 are stacked in this order on the main surface 10*a* of the glass plate 10, by sputtering or CVD.

It is preferable that the adhesive layer 40*ad* be a titanium layer. However, the adhesive layer may not be provided.

Next, as illustrated in FIG. 4F, a dry film resist is laminated using a roll laminator or the like, and a third resist layer RE3 is provided on the copper layer 50B and a fourth resist layer RE4 is provided on the copper layer 20B by photolithography. The third resist layer RE3 acts as a protective layer for preventing etching of areas other than target areas.

Next, a region of the copper layer 50B not covered with the third resist layer RE3 on the glass main surface 10*a* side is removed with a first etching agent, the titanium layer 50A is removed with a second etching agent, the dielectric layer 40 is removed by dry etching, and the adhesive layer 40*ad* is removed, to obtain the substrate illustrated in FIG. 4G. In the case where the adhesive layer 40*ad* is made of titanium, it is etched with the second etching agent The first etching agent is preferably an acid aqueous solution with a pH within the range of 0.5 or more and 2 or less. The acid aqueous solution preferably contains at least one of sulfuric acid and aqueous hydrogen peroxide, and more preferably contains both of them.

The temperature of the first etching agent is preferably within the range of 20° C. or more and 40° C. or less, and more preferably in the range of 25° C. or more and 35° C. or less.

The second etching agent is preferably a weak alkaline aqueous solution with a pH within the range of 7 or more and 12 or less, and more preferably a weak alkaline aqueous solution with a pH within the range of 8 or more and 10 or less. The weak alkaline solution is preferably a mixture of ammonia water and aqueous hydrogen peroxide.

The temperature of the second etching agent is preferably within the range of 20° C. or more and 40° C. or less, and preferably in the range of 25° C. or more and 35° C. or less.

Since the first and second etching agents range from acidic to weak alkaline, and can be used near room temperature, the glass is not damaged.

Next, the third resist layer RE3 and the fourth resist layer RE4 is stripped away using a sodium hydroxide solution, a TMAH solution, or the like, as illustrated in FIG. 4H, and the electroless nickel plating layer 60 is formed on the entire substrate including in the through-hole TH. The electroless nickel plating layer 60 serves as the seed layer of the second electrolytic copper plating layer 70 illustrated in FIG. 4J.

An electroless nickel plating solution includes metallic salt containing nickel and a reducing agent. The metallic salt containing nickel can be nickel sulfate, nickel chloride, or a mixture of them, for example. The density of the metallic salt containing nickel included in the electroless nickel plating solution is preferably within the range of 10 or more and 50 g/L or less, more preferably within the range of 15 or more and 45 g/L or less, and further preferably within the range of 20 or more and 30 g/L or less.

The reducing agent reduces the metallic salt containing nickel. The reducing agent can be formalin, hydrazine, hypophosphorous acid, sodium hypophosphite, sodium borohydride, or a mixture of them, for example. However, it is preferable to use hypophosphorous acid, sodium hypophosphite, or a mixture of these. The density of the reducing agent included in the electroless nickel plating solution is preferably within the range of 10 or more and 50 g/L or less, more preferably within the range of 15 or more and 45 g/L or less, and further preferably within the range of 20 or more and 30 g/L or less.

The electroless nickel plating solution may further include a metal-based additive, an organic additive, a complexing agent, a pH adjusting agent, a buffering agent, or a mixture thereof.

The metal-based additive enhances the stability of the electroless nickel plating solution. The metal-based additive contains lead, bismuth, or a mixture of these.

The organic additive facilitates the precipitation of nickel. The organic additive contains sulfur, for example.

The complexing agent can be ammonium hydroxide, sodium citrate, ethylene glycol, or a mixture of them, for example. The density of the complexing agent included in the electroless nickel plating solution is preferably within the range of 10 or more and 50 g/L or less, more preferably within the range of 10 or more and 40 g/L or less, and further preferably within the range of 20 or more and 30 g/L or less.

The pH adjusting agent can be sodium hydroxide, ammonia, sulfuric acid, or a mixture of them, for example.

The buffering agent can be sodium citrate, boric acid, carbonic acid, or a mixture of them.

The electroless nickel plating solution may contain ammonium chloride. The density of the ammonium chloride included in the electroless nickel plating solution is preferably within the range of 10 or more and 50 g/L or less, more preferably within the range of 10 or more and 40 g/L or less, and further preferably within the range of 20 or more and 30 g/L or less.

In the electroless plating process, the pH of the electroless nickel plating solution is preferably within the range of 6 or more and 10 or less, more preferably in the range of 8.0 or more and 9.5 or less.

Furthermore, the temperature of the electroless nickel plating solution is preferably within the range of 30° C. or more and 60° C. or less.

The formulation of the above-described electroless nickel plating solution obtains an electroless nickel plating film having a phosphorus content within the range of 0.5 or more and less than 5 mass %.

Next, as illustrated in FIG. 4I, a dry film resist is laminated on using a roll laminator or the like, and a fifth resist layer RE5 having openings RE5A and RE5B and a sixth resist layer RE6 having an opening RE6A are formed on the electroless nickel plating layer 60 by photolithography.

Next, as illustrated in FIG. 4J, the second electrolytic copper plating layer 70 is formed in the openings RE5A, RE5B, and RE6A.

Next, the fifth resist layer RE5 and the sixth resist layer RE6 are stripped way the substrate illustrated in FIG. 4J in a sodium hydroxide solution, a TMAH solution, or the like, and the electroless nickel plating layer 60 and the copper layer 20B are etched with the first etching agent and the titanium layer 20A is etched with the second etching agent, to obtain the substrate illustrated in FIG. 4K.

Next, as illustrated in FIG. 4L, insulating layers 80 are bonded to both the glass main surface 10a and the glass main surface 10b with a vacuum-press laminator to form a resin plug PL in the through-hole TH, and the a via 80V is formed with laser or the like.

Next, as illustrated in FIG. 4M, the seed layer 80s is formed by an electroless nickel plating film or an electroless copper plating film.

Next, as illustrated in FIG. 4N, a method the same as that described above is used to form a seventh resist layer RE7 having an opening RE7A and an eighth resist layer RE8, and to form an electrolytic copper plating layer 80C in the opening RE7A.

Next, the seventh resist layer RE7 and the eighth resist layer RE8 are stripped away in a sodium hydroxide solution, a TMAH solution, or the like, and unnecessary parts of the seed layer 80s is etched, as illustrated in FIG. 4O.

Next, the steps from FIG. 4L to FIG. 4O are repeated to obtain a substrate including a resin layer 90, a via 90V, a seed layer 90s, and an electrolytic copper plating layer 90C, as illustrated in FIG. 4P.

Next, a solder resist layer 100 having an opening 100A is formed, as illustrated in FIG. 4Q. The solder resist is applied with a roll coater in the case of a liquid resist, or is formed with a laminator in the case of dry film, and then an opening is formed by photolithography.

Next, a surface-treatment layer 110 is provided in the opening 100A provided in the solder resist layer, and a solder layer 120 is provided, as illustrated in FIG. 4R. The first solder layer 120 can be formed by a publicly known method such as screen printing, solder ball transfer mounting, or electrolytic plating.

As described above, the multi-layer circuit board 3 illustrated in FIG. 3 including the glass core 2 (FIG. 2) can be obtained.

According to this embodiment, the second electrolytic copper plating layer 70 can be reliably formed above the dielectric layer 40, and in this way, the multi-layer circuit board can be formed.

Furthermore, by performing the step of forming the electrolytic copper plating layer 70 in the through-hole TH immediately before the resin plug PL in the through-hole TH, the accumulation of stress from the copper applied to the through-hole TH over time can be mitigated, in comparison with a case in which the electrolytic copper plating layer is formed in a through-hole TH simultaneously with the first electrolytic copper plating layer 30, and the risk of glass breakage can be reduced.

Furthermore, in an example, the roughness of the surface of the glass plate 10 obtained by using a contactless interference microscope is 0.5 nm before the start of manufacture, and 0.55 nm after the manufacture. Therefore, such a manufacturing method can suppress damage to the glass, that is, the risk of glass breakage in the manufacturing process can be reduced.

Furthermore, the dry etching of the dielectric layer 40 is preferably performed in a state in which the pattern density is low as possible. In this embodiment, since the second electrolytic copper plating layer around the through-hole TH is formed after dry etching, the pattern density on the glass surface during dry etching is low. Thus, the surface configuration of the substrate facilitates dry etching, and thereby failure in dry etching can be reduced.

According to this embodiment described above, failure in the formation of an electrolytic copper plating layer on the dielectric layer provided above the glass core can be prevented. Furthermore, by using an acidic etching agent on an electroless nickel plating film having a phosphorus content of less than 5 mass %, glass breakage can be effectively prevented, and by mitigating the accumulation of stress to the through-hole in the glass, cracking in the through-hole in the manufacturing process can be suppressed.

The present invention is not limited to the embodiments and modification examples described above. Besides, various modification examples can be carried out without deviating from the gist of the present invention.

EXAMPLES

Examples of the present invention will now be described.

Example 1

Figure 5:
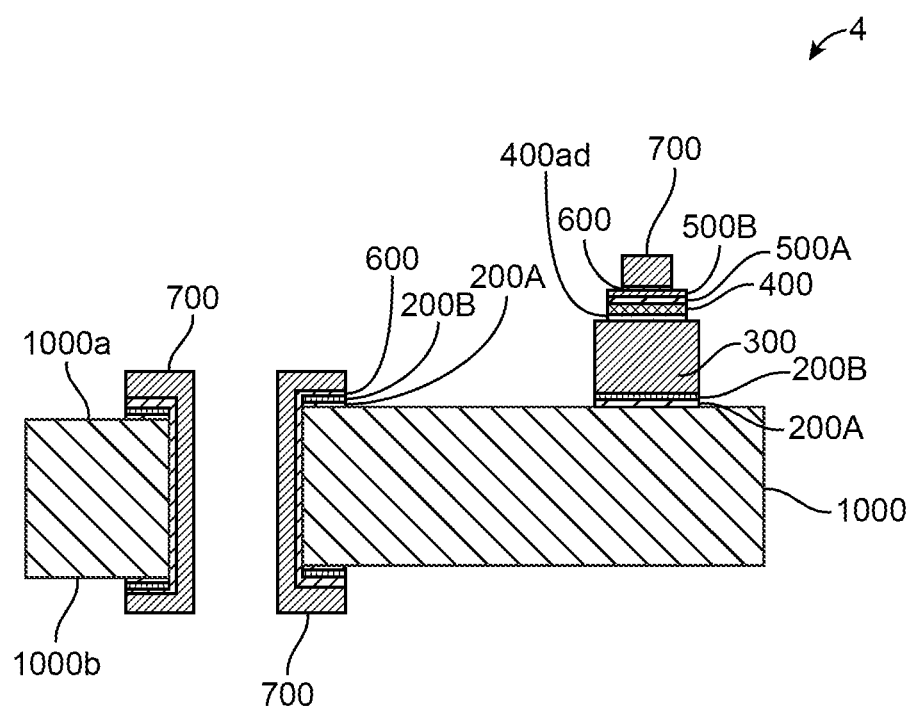
FIG. 5 is a schematic cross-sectional view of a glass core 4 according to an example of the present invention.

A glass core 4 illustrated in FIG. 5 was manufactured in accordance with the manufacturing process illustrated in FIGS. 6A to 6I.

Figure 6A:
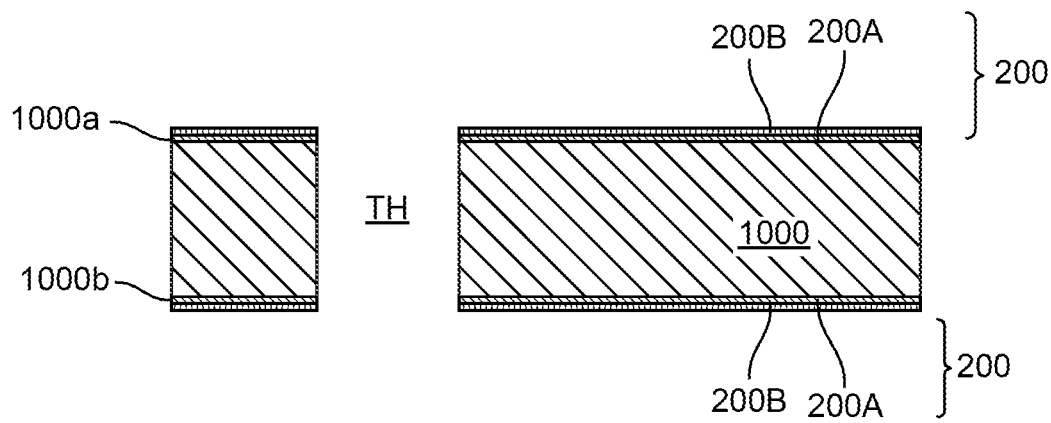
FIG. 6A is a schematic cross-sectional view of a manufacturing process of a glass core 4 according to an example of the present invention.

First, as illustrated in FIG. 6A, a 200-μm thick, 500×500-mm glass panel 1000 (EAGLE XG available from Corning Incorporated) with a through-hole TH was prepared. The roughness of the surface of the glass plate 1000 measured by a contactless interference microscope was 0.5 nm.

The diameter of the through hole TH formed in the glass plate 1000 was 80 μm on the first main surface of the glass plate 1000 and was 60 μm on the second main surface of the glass plate 1000. Note that the diameters are the same in the drawings.

Next, a 50-nm titanium layer 200A and a 300-nm copper layer 200B were formed in this order on one of the main surfaces of the glass plate 1000 as a first metal layer 200 by sputtering.

Figure 6B:
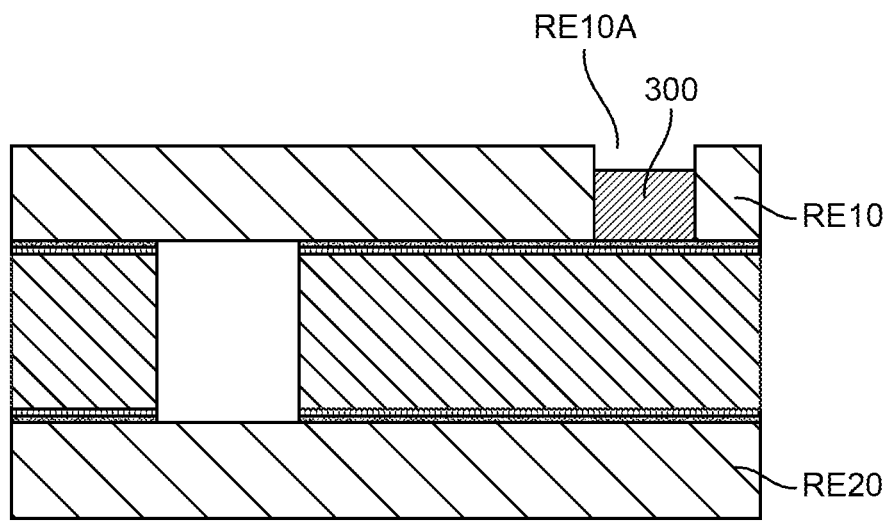
FIG. 6B is a schematic cross-sectional view of a manufacturing process of a glass core 4 according to an example of the present invention.

Next, as illustrated in FIG. 6B, by laminating a photosensitive dry film resist on the copper layer 200B using a roll laminator, a first resist layer RE10 and a second resist layer RE20 were formed. A 500×500-μm opening RE10A is formed, and a first electrolytic copper plating layer 300 was deposited in the opening RE10A with a thickness of 10 μm by electrolytic plating.

Figure 6C:
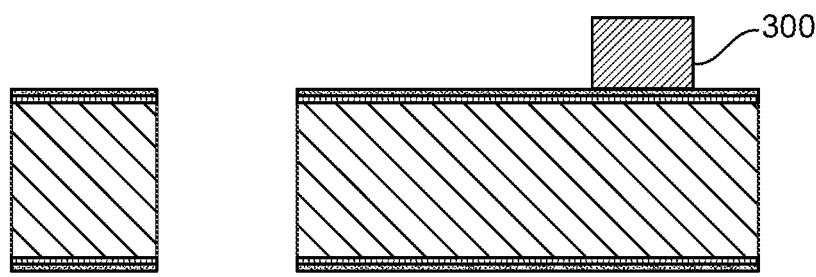
FIG. 6C is a schematic cross-sectional view of a manufacturing process of a glass core 4 according to an example of the present invention.

Next, the substrate obtained in the step in FIG. 6B was immersed in a 5% sodium hydroxide aqueous solution at 50° C. to strip the first resist layer RE10 and the second resist layer RE20, and the substrate in FIG. 6C was obtained.

Figure 6D:
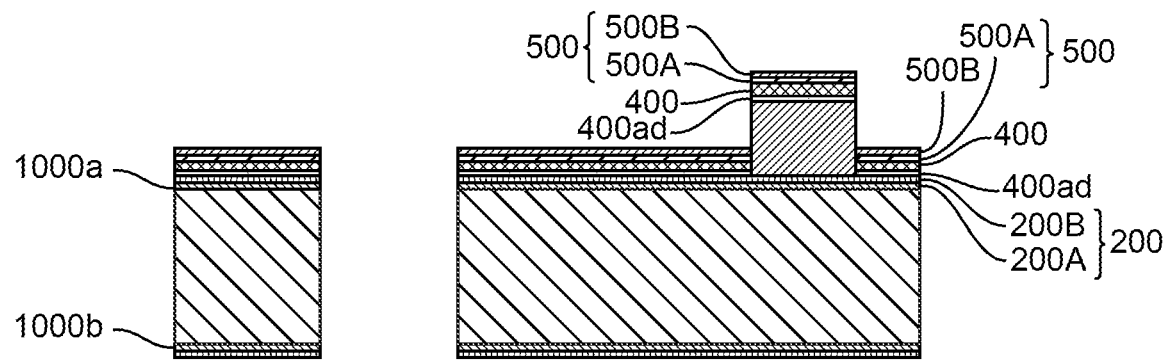
FIG. 6D is a schematic cross-sectional view of a manufacturing process of a glass core 4 according to an example of the present invention.

Next, as illustrated in FIG. 6D, on the glass main surface, a 50-nm thick titanium layer was formed as an adhesive layer 400ad, a 200-nm thick aluminum oxide layer was formed as a dielectric layer 400, a 50-nm thick titanium layer 500A was formed as a second metal layer 500, and a 300-nm thick copper layer 500B was formed, in this order.

Figure 6E:
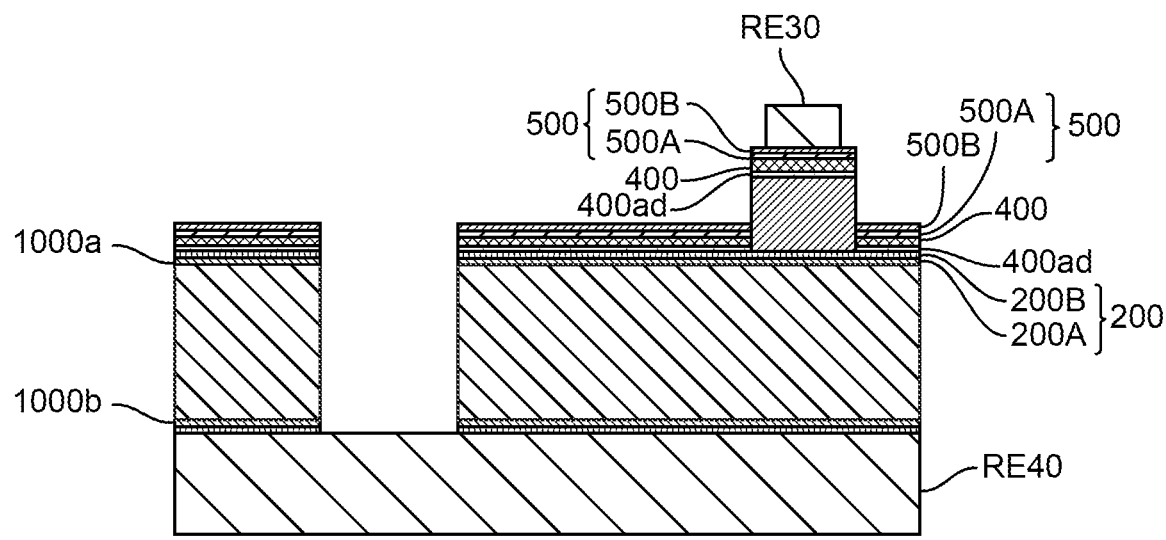
FIG. 6E is a schematic cross-sectional view of a manufacturing process of a glass core 4 according to an example of the present invention.

Next, as illustrated in FIG. 6E, a 400×400-μm resist layer RE30, which is slightly smaller than the electrode size 500×500 μm of the first electrolytic copper plating layer 300, was formed by lamination and photolithography using a photosensitive dry film resist. A dry film resist layer RE40 was formed on one of the glass main surface 1000a and the main surface 1000b opposing the glass main surface 1000a.

Figure 6F:
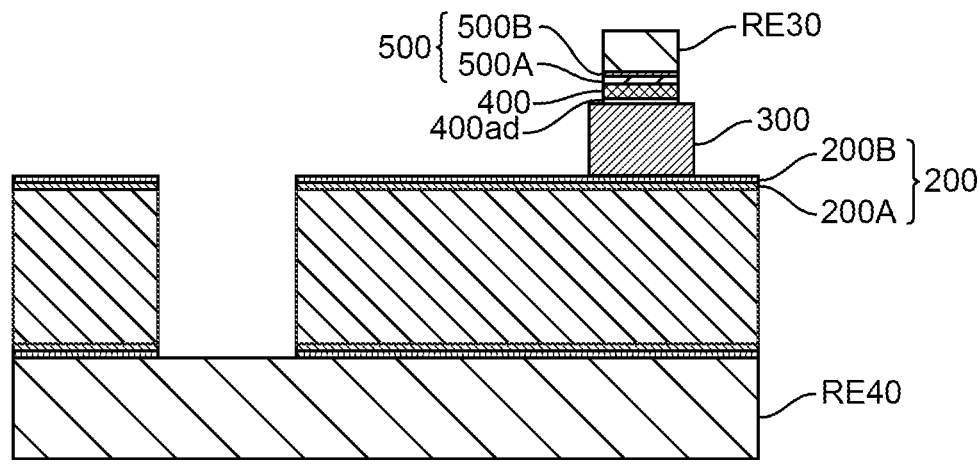
FIG. 6F is a schematic cross-sectional view of a manufacturing process of a glass core 4 according to an example of the present invention.
Figure 6G:
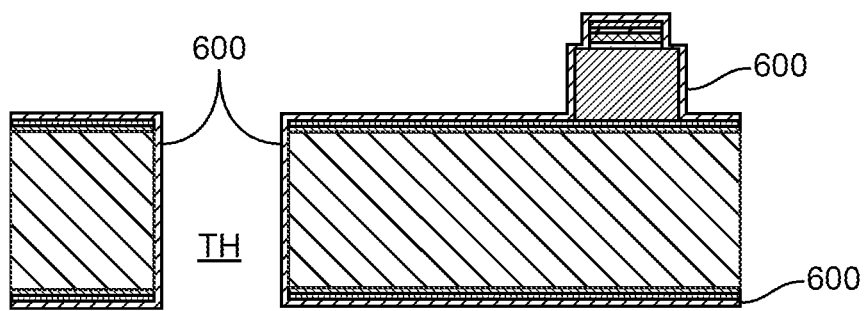
FIG. 6G is a schematic cross-sectional view of a manufacturing process of a glass core 4 according to an example of the present invention.

Next, as illustrated in FIG. 6F, a 300-nm thick copper layer 500B, a 50-nm thick titanium layer 500A, an aluminum oxide layer serving as the 200-nm thick dielectric layer 400, and a 50-nm thick titanium layer 400ad formed on an area of the glass main surface not protected with the resist layer RE30 were etched in this order. The copper layer 500B was etched using a mixed solution of sulfuric acid and hydrogen peroxide (pH 1, temperature 25° C.), which served as a first etching agent. The titanium layer 500A and the titanium layer 400ad were etched using a mixed solution of hydrogen peroxide and aqueous ammonia (pH 9, temperature 25° C.), which served as a second etching agent. The aluminum oxide layer serving as the 200-nm thick dielectric layer 400 was removed by dry etching.

Next, the substrate illustrated in FIG. 6F was immersed in a 5% sodium hydroxide aqueous solution at 50° C. to strip the resist layer RE30 and the dry resist layer RE40. After stripping, the glass core was catalyzed by a solution including palladium. The glass core was then immersed in the following electroless nickel plating solution A to form an electroless nickel plating layer 600. In this way, the substrate illustrated in FIG. 6G was obtained.

The bath configuration of the electroless nickel plating solution A is as follows.
Bath Composition: Nickel sulfate 20 g/L, Sodium hypophosphite 25 g/L, Lactic acid 30 g/L, Lead ion 1 ppm (residue is deionized water)
pH: 8.5
Temperature: 40° C.

The thickness of the electroless nickel plating layer was measured to be 0.1 μm. The phosphorus contents of the electroless nickel plating layer measured by the method described above was 4 mass %.

Figure 6H:
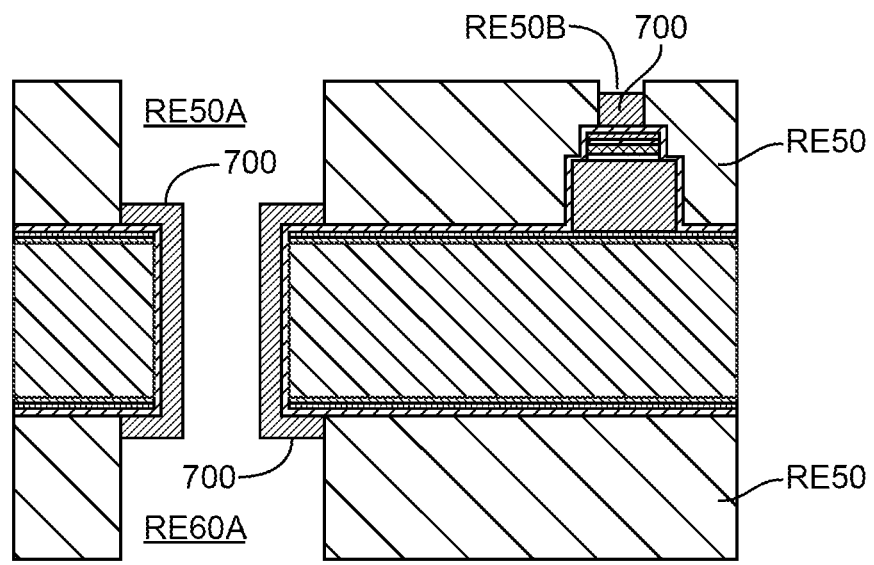
FIG. 6H is a schematic cross-sectional view of a manufacturing process of a glass core 4 according to an example of the present invention.

Next, as illustrated in FIG. 6H, photosensitive dry film resist layers RE50 and RE60 having openings RE50A, RE50B, and RE60A were formed on the glass main surface and an opposing main surface by the same method described above, and a second electrolytic copper plating layer 700 was formed by electrolytic plating. At this time, the thickness of the second electrolytic copper plating layer 700 was approximately 10 μm.

Figure 6I:
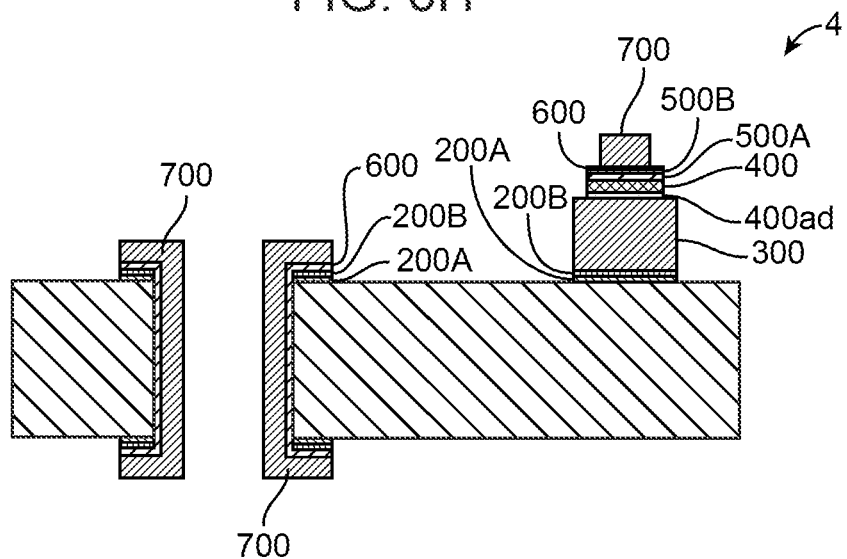
FIG. 6I is a schematic cross-sectional view of a manufacturing process of a glass core 4 according to an example of the present invention.

Next, as illustrated in FIG. 6I, the resist layer RE50 and the resist layer RE60 were stripped away in a 5% sodium hydroxide aqueous solution at 50° C. The electroless nickel plating layer 600 and the copper layer 200B were etched using a mixed solution of sulfuric acid and hydrogen peroxide (pH 1, temperature 25° C.), which served as a first etching agent. The titanium layer 200A was etched using a mixed solution of hydrogen peroxide and aqueous ammonia (pH 9, temperature 25° C.), which served as a second etching agent. Thus, the glass core 4 illustrated in FIG. 5 was obtained.

Example 2

In Example 2, a glass core was manufactured by the same method as that for the bath configuration of the electroless nickel plating solution A according to Example 1 except that the pH was 9, and the temperature was 50° C. The plating time was adjusted so that the thickness of the electroless nickel plating layer reached 0.1 μm.

The thickness of the electroless nickel plating layer manufactured in this example was measured to be 0.1 μm. The phosphorus content of the electroless nickel plating layer measured by the method described above was 1 mass %.

Comparative Example 1

In Comparative Example 1, a glass core was manufactured by the same method as that in Example 1 except that the following electroless nickel plating solution B was used as an electroless nickel plating solution to form an electroless nickel plating layer having a phosphorus content of 6 mass %. The following third etching agent was used as the etching agent of the electroless nickel plating layer.

The bath configuration of the electroless nickel plating solution B is as follows.

Bath Composition: Nickel sulfate 20 g/L, Sodium hypophosphite 25 g/L, Lactic acid 30 g/L, Lead ion: 1 ppm (residue is deionized water)
pH: 4.6 Temperature: 80° C.
The third etching agent is composed of a solution including 25% sodium hydroxide (pH 14, 80° C.).

Comparative Example 2

Figure 7A:
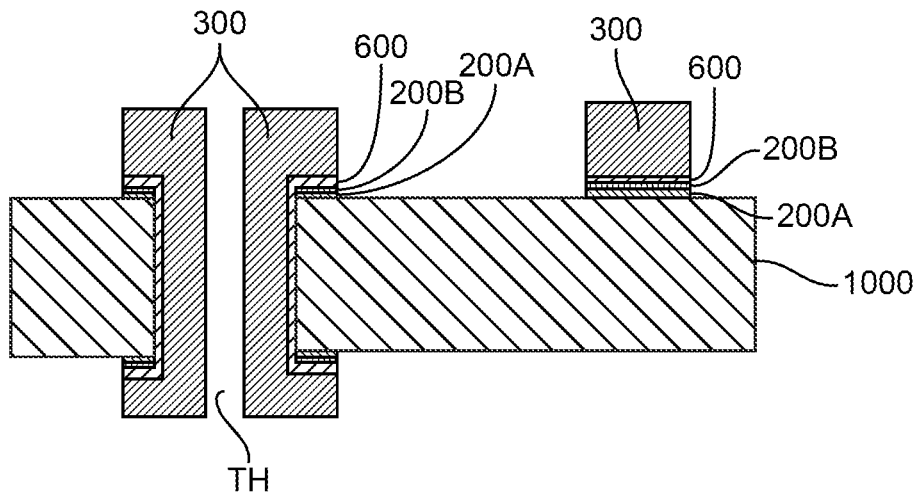
FIG. 7A is a schematic cross-sectional view of a manufacturing process of a glass core according to a comparative example of the present invention.

A glass plate that is the same as in Example 1 was used: a titanium layer 200A, a copper layer 200B, and an electroless nickel plating layer 600 were stacked on the glass plate 1000 in this order; the electroless nickel plating layer 600 was formed in a through-hole TH; a resist was provided by the same method as that in Example 1; an electrolytic copper plating layer 300 was formed on the electroless nickel plating layer 600; and the resist layer was stripped away to obtain the substrate illustrated in FIG. 7A. The electroless nickel plating solution A was used as an electroless nickel plating solution.

Figure 7B:
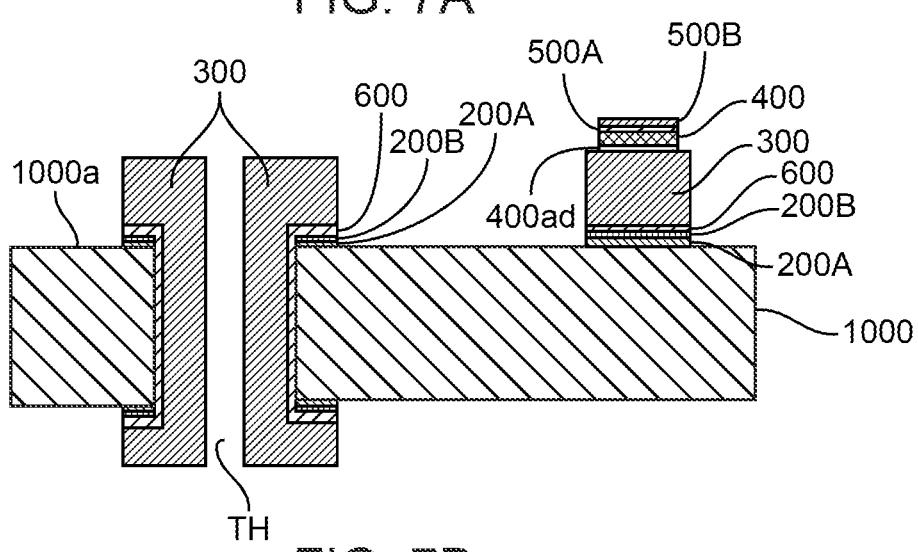
FIG. 7B is a schematic cross-sectional view of a manufacturing process of a glass core according to a comparative example of the present invention.

By the same method as that in Example 1, a 50-nm thick titanium layer was formed as an adhesive layer 400ad, a 200-nm thick aluminum oxide layer was formed as a dielectric layer 400, a 50-nm thick titanium layer 500A was formed as a second metal layer 500, and a 300-nm thick copper layer 500B was formed, in this order on the glass main surface 100a; and a predetermined region was protected with a resist. Furthermore, a 300-nm thick copper layer 500B that was not protected by the resist layer and unwanted, a 50-nm thick titanium layer 500A, a dielectric layer serving as a 200-nm thick aluminum oxide layer 400, and a 50-nm thick titanium layer 400ad were sequentially etched. The copper layer 500B was etched using a mixed solution of sulfuric acid and hydrogen peroxide (pH 1, temperature 25° C.), which serves as a first etching agent; the titanium layer 500A and the titanium layer 400ad were etched using a mixed solution of hydrogen peroxide and aqueous ammonia (pH 9, temperature 25° C.), which serves as a second etching agent; and the dielectric layer serving as the 200-nm thick aluminum oxide layer 400 was removed by dry etching. In this way, the substrate illustrated in FIG. 7B was obtained.

Figure 7C:
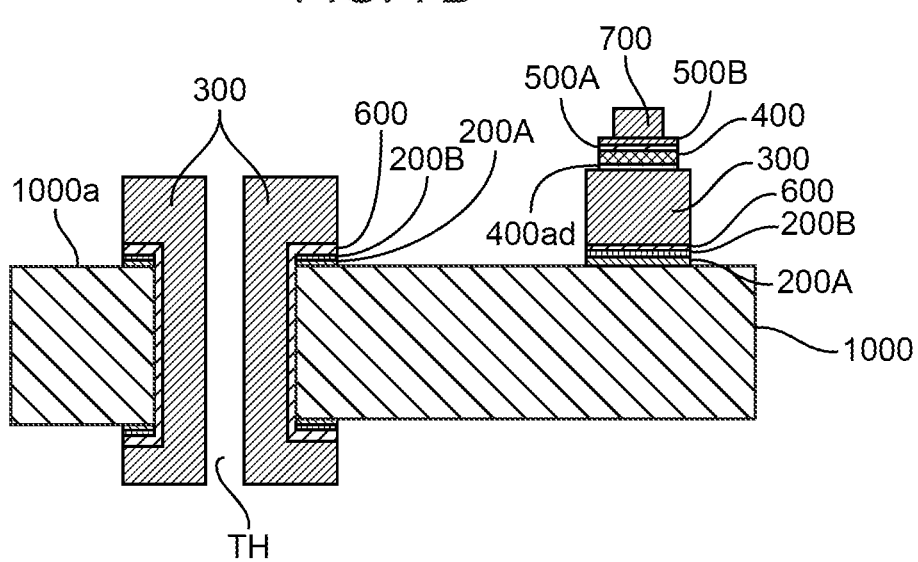
FIG. 7C is a schematic cross-sectional view of a manufacturing process of a glass core according to a comparative example of the present invention.

An electrolytic copper plating layer 700 was provided on the copper layer 500B by the same method as that in Example 1, to obtain the substrate illustrated in FIG. 7C.

<Evaluation>

Each of the glass cores manufactured in the examples and the comparative examples were evaluated for the formation of an electrolytic copper plating layer on a dielectric layer, cracking in the through-hole formed in the glass, and breakage of the glass panel.

[Formation of Electrolytic Copper Plating Layer on Dielectric Layer]

The glass cores manufactured in the examples and the comparative examples were examined with a stereomicroscope for a predetermined conductive pattern on the dielectric layer (number of samples N=100).

[Crack in Through-Hole]

The cross-section of the glass cores manufactured in the examples and the comparative examples was examined for glass cracking inside the through-hole (number of samples N=100).

[Breakage of Glass Panel]

The flat surface of the glass panel manufactured in the examples and the comparative examples was examined for breakage and cracking (number of samples N=10).

Table 1 shows the evaluation results of Examples 1 and 2 and Comparative Examples 1 and 2. In the evaluation results, a pass rate of 100% is defined as "good," and a pass rate of less than 100% is defined as "poor." The pass rate is shown together with the ratio of the number of defects to the number of samples (number of defects/number of samples).

TABLE 1

| Items | Example 1 | Example 2 | Comparative Example 1 | Comparative Example 2 |
|---|---|---|---|---|
| Cross-sectional Structure of Examples and Comparative Examples | In the structure illustrated in FIG. 6I the electroless nickel plating layer 60 is provided directly under the first electrolytic copper plating layer 300 and the second electrolytic copper plating layer 700. | | | In the structure illustrated in FIG. 7C the electroless nickel plating layer 600 is only provided directly under the first electrolytic copper plating layer 300. |
| Type of electroless nickel plating solution | A | A | B | A |
| Phosphorus Content | 4 | 1 | 6 | 4 |
| Etching Agent for Electroless Nickel Plating Layer | First Etching Agent (Acid) | First Etching Agent (Acid) | Third Etching Agent (Alkaline) | First Etching Agent (Acid) |
| Formation of Electrolytic Copper Plating Layer on Dielectric Layer | Good 100/100 OK | Good 100/100 OK | Poor 90/100 OK | Poor 92/100 OK |
| Cracking in Through-hole | Good 100/100 OK | Good 100/100 OK | Poor 95/100 OK | Poor 95/100 OK |
| Breakage of Glass Panel | Good 10/10 OK | Good 10/10 OK | Poor 9/10 OK | Good 10/10 OK |

As shown in Table 1, it was confirmed that, in the glass cores according to Examples 1 and 2, the electrolytic copper plating layer can be formed on the dielectric layer with a probability of 100%. No glass cracking inside the through-hole or breakage of the glass panel surface was observed.

In contrast, for the glass core according to Comparative Example 1, glass cracking inside the through-hole or breakage of the glass panel surface was observed. For the glass core according to Comparative Example 2, no breakage of the glass panel surface was observed, but glass cracking were observed inside the through-hole.

REFERENCE SIGNS LIST

1 . . . Glass core; TH Through-hole; PL . . . Resin Plug; RE1, RE2, RE3, RE4, RE5, RE6, RE10, RE20, RE30, RE40, RE50, RE60 . . . Resist layer; 10, 1000 . . . Glass plate; 20, 200 . . . First metal layer; 30, 300 . . . First electrolytic copper plating layer; 40, 400 . . . Dielectric layer; 40ad, 400ad . . . Adhesive layer; 50, 500 . . . Second metal layer; 60, 600 . . . electroless nickel plating solution; 70, 700 . . . Second electrolytic copper plating layer; 80V, 90V . . . Via; 80C, 90C . . . Electrolytic copper plating layer; 80s, 90s . . . Seed layer; 100 . . . Solder resist layer; 110 . . . Surface treatment layer; 120 . . . Solder.

What is claimed is:

1. A glass core, comprising:
    a glass plate consisting of glass;
    a first metal layer in direct contact with the glass plate;
    a first electrolytic copper plating layer provided on the first metal layer;
    a dielectric layer on the first electrolytic copper plating layer on the glass plate;
    a second metal layer on the dielectric layer;
    an electroless nickel plating layer on the second metal layer and having a phosphorus content of less than 5 mass %; and
    a second electrolytic copper plating layer on the electroless nickel plating layer.

2. The glass core of claim 1, wherein the glass plate has a though-hole, and at least the electroless nickel plating layer and the second electrolytic copper plating layer are sequentially stacked on an inner wall of the through-hole.

3. The glass core of claim 1, wherein the dielectric layer includes at least one of aluminum oxide, tantalum oxide, and silicon nitride.

4. The glass core of claim 1, wherein the first metal layer and the second metal layer are sputtered laminated films of titanium and copper.

5. A multilayer circuit board in which a resin layer and a wiring layer are alternately stacked on the glass core of claim 1.

6. The glass core of claim 1, wherein the dielectric layer is in direct contact with the first electrolytic copper plating layer, the first electrolytic copper plating layer is direct contact with the first metal layer.

7. The glass core of claim 6, wherein a contact area between the first electrolytic copper plating layer and the first metal layer is greater than a contact are between the dielectric layer and the first electrolytic copper plating layer.

8. The glass core of claim 6, wherein the first metal layer is a laminate consisting of sputtered titanium and sputtered copper.

9. A method of manufacturing a glass core, comprising:
    forming a first metal layer in direct contact with a glass plate consisting of glass;
    forming a first electrolytic copper plating layer above the first metal layer;
    forming a dielectric layer on the first electrolytic copper plating layer;
    forming a second metal layer on the dielectric layer;
    forming an electroless nickel plating layer on the second metal layer, the electroless nickel plating layer having a phosphorus content of less than 5 mass %;
    forming a second electrolytic copper plating layer on the electroless nickel plating layer; and
    removing unnecessary parts of the electroless nickel plating layer using an acidic etching agent.

10. The method of manufacturing a glass core of claim 9, wherein
    the glass plate has a through-hole,
    the electroless nickel plating layer having a phosphorus content of less than 5 mass % is formed on an inner wall of the through-hole in the step of forming the electroless nickel plating layer having a phosphorus content of less than 5 mass % on the second metal layer, and
    the second electrolytic copper plating layer is formed on the electroless nickel plating layer having the through-hole.

* * * * *